US012349314B2

(12) United States Patent
Huang et al.

(10) Patent No.: US 12,349,314 B2
(45) Date of Patent: Jul. 1, 2025

(54) VAPOR CHAMBER AND MANUFACTURING METHOD THEREOF, MIDDLE FRAME ASSEMBLY AND MANUFACTURING METHOD THEREOF, AND ELECTRONIC DEVICE

(71) Applicant: Huawei Technologies Co., Ltd., Shenzhen (CN)

(72) Inventors: Lizhong Huang, Dongguan (CN); Yandang Qiao, Shenzhen (CN); Jian Mao, Dongguan (CN); Peijun Wang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 225 days.

(21) Appl. No.: 17/919,635

(22) PCT Filed: Mar. 30, 2021

(86) PCT No.: PCT/CN2021/084122
§ 371 (c)(1),
(2) Date: Oct. 18, 2022

(87) PCT Pub. No.: WO2021/208731
PCT Pub. Date: Oct. 21, 2021

(65) Prior Publication Data
US 2023/0171924 A1 Jun. 1, 2023

(30) Foreign Application Priority Data

Apr. 18, 2020 (CN) .......................... 202010308678.1

(51) Int. Cl.
*H05K 7/20* (2006.01)
*F28D 15/04* (2006.01)
(Continued)

(52) U.S. Cl.
CPC ....... *H05K 7/20336* (2013.01); *F28D 15/046* (2013.01); *G06F 1/203* (2013.01);
(Continued)

(58) Field of Classification Search
CPC ............ H05K 7/2029; H05K 7/20336; H05K 7/2039; H05K 7/20436; F28D 2015/0216;
(Continued)

(56) References Cited

U.S. PATENT DOCUMENTS

2007/0295486 A1  12/2007 Su et al.
2011/0192576 A1* 8/2011 Wang ................. F28D 15/0233
                                              165/104.26
(Continued)

FOREIGN PATENT DOCUMENTS

CN  104764350 A  7/2015
CN  109151135 A  1/2019
(Continued)

*Primary Examiner* — Zachary Pape
*Assistant Examiner* — Steven Ngo
(74) *Attorney, Agent, or Firm* — Conley Rose, P.C.

(57) ABSTRACT

A middle frame assembly includes a middle frame, connectors, and a vapor chamber. The middle frame is provided with a through hole, the connectors are fixedly coupled to the middle frame, and some of the connectors are exposed to form a welding part. The vapor chamber includes a vapor chamber body and a surrounding edge surrounding the vapor chamber body. The vapor chamber is accommodated in the through hole, and the surrounding edge is welded to the welding part. The connectors are configured to couple the middle frame and the vapor chamber and are welded to the vapor chamber.

19 Claims, 25 Drawing Sheets

(51) Int. Cl.
*F28F 3/12* (2006.01)
*G06F 1/20* (2006.01)
*H04M 1/02* (2006.01)

(52) U.S. Cl.
CPC ............. *F28F 3/12* (2013.01); *H04M 1/0202* (2013.01); *H04M 1/0249* (2013.01)

(58) Field of Classification Search
CPC ........ F28D 2015/0225; H04M 1/0202; H04M 1/026
See application file for complete search history.

(56) References Cited

U.S. PATENT DOCUMENTS

| | | | |
|---|---|---|---|
| 2016/0128233 A1* | 5/2016 | Lai | F28D 15/0233 165/104.26 |
| 2019/0033006 A1 | 1/2019 | Vanderwees et al. | |
| 2020/0003501 A1 | 1/2020 | Wakaoka | |
| 2020/0116436 A1 | 4/2020 | Kuo et al. | |
| 2021/0095930 A1 | 4/2021 | Inagaki et al. | |
| 2022/0132697 A1* | 4/2022 | Inagaki | H05K 7/2029 |
| 2023/0019481 A1* | 1/2023 | Jin | H04M 1/185 |

FOREIGN PATENT DOCUMENTS

| | | |
|---|---|---|
| CN | 110035643 A | 7/2019 |
| CN | 110213947 A | 9/2019 |
| CN | 110260697 A | 9/2019 |
| CN | 110267499 A | 9/2019 |
| CN | 110476032 A | 11/2019 |
| CN | 111010858 A | 4/2020 |
| TW | M299458 U | 10/2006 |
| TW | M583041 U | 9/2019 |
| TW | 202014660 A | 4/2020 |
| WO | 2019230385 A1 | 12/2019 |

* cited by examiner

VAPOR CHAMBER AND MANUFACTURING METHOD THEREOF, MIDDLE FRAME ASSEMBLY AND MANUFACTURING METHOD THEREOF, AND ELECTRONIC DEVICE

CROSS-REFERENCE TO RELATED APPLICATIONS

This is a U.S. National Stage of International Patent Application No. PCT/CN2021/084122 filed on Mar. 30, 2021, which claims priority to Chinese Patent Application No. 202010308678.1 filed on Apr. 18, 2020. Both of the aforementioned applications are hereby incorporated by reference in their entireties.

TECHNICAL FIELD

This application relates to the field of mobile communication, and in particular, to a vapor chamber and a manufacturing method thereof, a middle frame assembly and a manufacturing method thereof, and an electronic device.

BACKGROUND

As a handheld mobile terminal (for example, a mobile phone) becomes increasingly intelligent, more and more antennas, more advanced chips and components, and high-capacity batteries are widely applied to the mobile phone, and may generate more heat in a running process. Excessive heat causes an excessively rising temperature of the mobile phone. Consequently, intuitive experience of a consumer is affected.

To solve a heat dissipation problem of the mobile phone, a two-phase heat dissipation method, like a vapor chamber, is usually used. Currently, the vapor chamber is usually made of a copper metal material. After a copper alloy material is sintered and formed at a high temperature, strength and hardness of the copper alloy material are reduced, so that the copper alloy material cannot be used as a structural carrying part integrally. In addition, defects such as deformation and depression easily occur after a slight external force is applied, causing a loss of thermal conductivity. A copper alloy has high density, which is not conducive to weight reduction of the mobile phone. In addition, a common manner of combining the vapor chamber with a middle frame of the mobile phone cannot fully meet a product requirement either. In this case, combining the vapor chamber and the middle frame causes a large thickness, which is not conducive to thinning of the mobile phone. The vapor chamber and the middle frame are usually combined by bonding, resulting in poor heat transfer performance and limited bonding strength.

It should be a research and development direction in the industry about how to manufacture a vapor chamber, resolve problems of low strength and high density of the vapor chamber, and how to combine the vapor chamber and the middle frame to implement a high-strength and ultra-thin connection between the vapor chamber and the middle frame, and enable the vapor chamber and the middle frame to have good thermal conduction performance.

SUMMARY

This application provides a vapor chamber and a manufacturing method thereof, a middle frame assembly and a manufacturing method thereof, and an electronic device. A composite plate is used to enable the vapor chamber to have characteristics of high strength and low density, and a unique manner of combining the vapor chamber with a middle frame is designed to implement a high strength and ultra-thin connection between the vapor chamber and the middle frame, so that the vapor chamber and the middle frame have good thermal conduction performance.

According to a first aspect, an embodiment provides a vapor chamber. The vapor chamber includes a first cover and a second cover. The second cover includes a first metal layer and a second metal layer. The first metal layer includes a main body region and an edge region surrounding the main body region. The second metal layer overlaps the main body region, and that the second metal layer overlaps the main body region means that the second metal layer is disposed on a surface of the main body region, and the edge region is not covered by the second metal layer. The edge region is configured to combine with an edge of the first cover to form a closed cavity between the first cover and the second cover. The second metal layer is located in the closed cavity. A wick structure is formed on a surface of the second metal layer, and material strength of the first metal layer is greater than material strength of the second metal layer.

In this application, the second cover is disposed as a composite plate, that is, the second cover includes the first metal layer and the second metal layer. The material strength of the first metal layer is greater than the material strength of the second metal layer, so that the vapor chamber has a high-strength characteristic.

A material of the second metal layer may be a metal material including copper, for example, a copper alloy. The copper alloy is easy to make a wick structure and has stability. In this application, the second cover is designed as a composite plate structure, so as to avoid a problem that when the vapor chamber is integrally made of a single metal material (for example, a copper metal material) with low strength, strength and hardness of a vapor chamber made of the copper metal material decrease after high-temperature sinter molding, and the vapor chamber made of the copper metal material cannot be integrally used as a structural carving part. In addition, the vapor chamber integrally made of the copper metal material is prone to have thermal conductivity loss due to deformation, recess and the like. However, the material strength of the first metal layer in this application is greater than that of a copper layer, so that the vapor chamber integrally has high strength. The wick structure in this application is formed by sintering on the copper layer, so that problems of difficult molding and a low yield of the wick structure on another metal material can be avoided. This implements a function of enhancing structural strength and heat dissipation performance of the vapor chamber.

Strength of a material of the first cover may also be greater than strength of a material of the second metal layer, so as to enhance strength of the vapor chamber.

In a possible implementation, in a direction perpendicular to a plane on which the first metal layer is located, a thickness of the copper layer is less than 0.15 mm. A function of the copper layer is to make a wick structure on the copper layer, provided that copper powder or a copper mesh can be placed on the copper layer to form the wick structure through sintering. Therefore, the copper layer may be thin. Reduction of the thickness of the copper layer helps reduce a thickness of the vapor chamber and make a mobile phone thinner. In addition, when the copper layer is thin, larger space may be reserved in a cavity to inject more working medium, which helps improve heat dissipation performance of the vapor chamber. In a preferred implementation, the copper layer may be copper metal with a thickness of 0.05 mm, the thickness of the copper layer may alternatively be 0.03 mm, and the thickness of the copper layer may be adjusted as required.

In a possible implementation, the edge region is in a sealed connection to the edge of the first cover by welding. Welding and sealing can enhance strength of bonding between the first metal layer and the first cover, to prevent leakage of a liquid working medium in the cavity.

Specifically, the first cover may include a third metal layer, and strength of a material of the third metal layer is greater than strength of a material of the second metal layer.

In a possible implementation, a material of the third metal layer and a material of the first metal layer are metal materials of a same type. The metal materials of a same type mean that the material of the third metal layer is the same as an element with highest content in the first metal layer. When the metal materials of the same type are welded, no brittle phase is generated, so that the metal materials of the same type have high welding strength.

In a possible implementation, a material of the third metal layer is a titanium alloy or stainless steel. Specifically, when the material of the third metal layer and the material of the first metal layer are metal materials of a same type, the material of the third metal layer and the material of the first metal layer may be both a titanium alloy, or the material of the third metal layer and the material of the first metal layer may be both stainless steel, or the material of the third metal layer and the material of the first metal layer may be another high-strength metal material.

In a possible implementation, a material of the third metal layer and a material of the first metal layer are metal materials of different types that have weldability. Weldability means that elements with highest content are different, a burning loss temperature of a metal with a low melting point is less than a melting point of a metal with a high melting point, no brittle phase is generated in a bonding region of the two metals, and hardness of a welding part is greater than the lowest hardness of the two metals by more than 80%. When the two metals with the weldability are welded, strength of bonding between the third metal layer and the first metal layer can be improved, to implement a good sealing effect and prevent leakage of a liquid working medium in a cavity.

In a possible implementation, a material of the third metal layer may be a titanium alloy, and a material of the first metal layer is a material weldable to the third metal layer (that is, the titanium alloy); or a material of the first metal layer is a titanium alloy, and a material of the third metal layer is a material weldable to the first metal layer (that is, the titanium alloy).

In a possible implementation, the first cover includes a first cover body. The second cover includes a second cover body. The first cover body and the second cover body are oppositely disposed with a spacing between them. The first cover body is provided with a first hole, and the second cover body is provided with a second hole. The vapor chamber further includes a sealing structure, and the sealing structure is in a sealed connection to the first cover body and the second cover body at the first hole and the second hole, and is connected to the first cover body and the second cover body, to jointly enclose the closed cavity. The first hole and the second hole are connected to the sealing structure to form a through hole that penetrates through the vapor chamber. The through hole is configured to allow a transmission line to pass through. For example, the transmission line may be a flexible circuit board, and the flexible circuit board passes through the through hole of the vapor chamber and is connected to a printed circuit board. The transmission line directly passes through the through hole of the vapor chamber and is connected to electronic components on two sides of the vapor chamber, so that an extension path of the transmission line is short and does not need to bypass from a periphery of the vapor chamber. This architecture not only helps save wiring space in the electronic device, but also ensures signal transmission quality of the transmission line.

In a possible implementation, the sealing structure includes a first boss and a second boss. The first boss is a structure that is integrated with the first cover body, and the first boss is formed at an edge of the first hole. The second boss is a structure that is integrated with the second cover body, and the second boss is formed at an edge of the second hole. The first boss is connected to the second boss, and the first hole is connected to the second hole to form the through hole of the vapor chamber. A sealing structure may be formed at a joint of the first boss and the second boss by welding, so as to seal a cavity.

In a possible implementation, the sealing structure includes a first boss. The first boss is a structure that is integrated with the first cover body, and the first boss is formed at an edge of a first hole of the first cover body. No boss structure needs to be disposed at a second hole of the second cover body. The first boss extends to a second through hole of the second cover body, and is sealed and welded with the second cover body, so that the first hole is connected to the second hole to form the through hole of the vapor chamber. The sealing structure in this implementation and the first cover body are an integrated structure.

In a possible implementation, the sealing structure includes a second boss. The second boss is a structure that is integrated with the second cover body, and the second boss is formed at an edge of a second hole of the second cover body. No boss structure needs to be disposed at a first hole of the first cover body. The second boss extends to the first hole of the first cover body, and is sealed and welded with the first cover body, so that the second hole is connected to the first hole to form the through hole of the vapor chamber. The sealing structure in this implementation and the second cover body are an integrated structure.

In a possible implementation, the sealing structure is a single structure independent of the first cover body and the second cover body. The sealing structure encloses a hollow channel, and the sealing structure includes a first connection end and a second connection end. At an edge of the first hole, the first connection end is sealed and welded with the first cover body. At an edge of the second hole, the second connection end is sealed and welded with the second cover body. The hollow channel of thy; sealing structure is connected between the first hole and the second hole, to form the through hole of the vapor chamber. In other words, the sealing structure and the vapor chamber are separated structures. Two ends of the sealing structure are connected to the cover bodies at the first hole and the second hole, so as to seal a cavity by welding.

The sealing structure may be a sleeve-type structure. In another possible implementation, the sealing structure may alternatively be a sheet-like structure. Two ends of the sheet-like sealing structure are respectively disposed around the first hole of the first cover body and the second hole of the second cover body, and jointly enclose the closed cavity. The sheet-like sealing structure may be flexibly disposed in shape because of a flexible feature. This saves space. In another possible implementation, the sealing structure may alternatively be in a form of paste. At positions around the first hole and the second hole, a paste-like metal fills up a gap between the first cover body and the second cover body. A paste-like material is cured by heating and pressurization or thermal diffusion, to form the sealing structure. The paste-like sealing structure can be formed by filling a paste-like material with some extent of deformation into the gap and curing the paste-like material.

In a possible implementation, a plane on which the first cover body is located is used as a reference plane. An extension direction of the through hole of the vapor chamber is perpendicular to the reference plane, or an included angle between an extension direction of the through hole of the vapor chamber and the reference plane is less than 90 degrees. The extension direction of the through hole of the vapor chamber may be set according to a requirement. When the included angle between the extension direction of the through hole of the vapor chamber and the reference plane is less than 90°, that is, the first through hole and the second through hole are disposed in a staggered manner, a flexible circuit board passes through the through hole, and a bending angle of the flexible circuit board is also less than 90°. This helps maintain good performance of the flexible circuit board and prolong a service life of the flexible circuit board.

In a possible implementation, the sealing structure is step-shaped, or an inner wall of the sealing structure is smoothly disposed. A shape of the inner wall of the sealing structure is not limited, provided that the inner wall can allow a transmission line to pass through without affecting performance of the transmission line.

In a possible implementation, a connection structure is disposed in the closed cavity, and two ends of the connection structure are fixedly connected to the first cover and the second cover. This avoids a problem that the first cover and the second cover easily interfere with another component due to deformation such as bulging and warping after the vapor chamber is heated. Specifically, the connection structure and the first cover may be an integrated structure, and are welded on an outer surface of the second cover to fasten the connection structure to the second cover. Alternatively, the connection structure and the second cover may be an integrated structure and are welded to the first cover.

According to a second aspect, this application provides a manufacturing method of a vapor chamber, including: manufacturing a first cover, where the first cover includes a third metal layer; manufacturing a second cover, where the second cover includes a first metal layer and a second metal layer, the second metal layer may be a copper layer, the first metal layer includes a main body region and an edge region surrounding the main body region, the second metal layer overlaps the main body region, that the second metal layer overlaps the main body region means that the second metal layer is disposed on a surface of the main body region and the edge region is not covered by the second metal layer, and material strength of the first metal layer is greater than material strength of the second metal layer; manufacturing a wick structure on a surface of the second metal layer of the second cover; and combining the first cover with the second cover, and fixedly connecting the edge region to an edge of the third metal layer, so as to form a closed cavity between the first cover and the second cover.

Specifically, material strength of the third metal layer is greater than material strength of the second metal layer.

In this application, the third metal layer is manufactured as the first cover, and the first metal layer and the copper layer are manufactured as the second cover. The first cover and the second cover are fixedly connected to form the vapor chamber with the closed cavity. Because strength of both a material of the third metal layer and a material of the first metal layer is greater than strength of the copper layer, the vapor chamber has a high-strength characteristic. The wick structure in this application is formed by sintering on the copper layer, so that problems of difficult molding and a low yield of the wick structure on another metal material can be avoided. This implements a function of enhancing structural strength and heat dissipation performance of the vapor chamber. The vapor chamber has good structural strength. When used in an electronic device, the vapor chamber may be used as a carrying part to carry a component in the electronic device.

In a possible implementation, the copper layer may be fastened to the main body region of the first metal layer by electroplating, rolling, thermal diffusion, or the like to form the second cover.

In a possible implementation, the edge region is in a sealed connection to the edge of the first cover by welding. Welding and sealing can enhance strength of bonding between the first metal layer and the third metal layer, to prevent leakage of a liquid working medium in the cavity.

In a possible implementation, a material of the third metal layer and a material of the first metal layer are metal materials of a same type. The metal materials of a same type mean that the material of the third metal layer is the same as an element with highest content in the first metal layer. When the metal materials of the same type are welded, no brittle phase is generated, so that the metal materials of the same type have high welding strength.

In a possible implementation, a material of the third metal layer is a titanium alloy or stainless steel. Specifically, when the material of the third metal layer and the material of the first metal layer are metal materials of a same type, the material of the third metal layer and the material of the first metal layer may be both a titanium alloy, or the material of the third metal layer and the material of the first metal layer may be both stainless steel, or the material of the third metal layer and the material of the first metal layer may be another high-strength metal material.

In a possible implementation, a material of the third metal layer and a material of the first metal layer are metal materials of different types that have weldability. Weldability means that elements with highest content are different, a burning loss temperature of a metal with a low melting point is less than a melting point of a metal with a high melting point, no brittle phase is generated in a bonding region of the two metals, and hardness of a welding part is greater than the lowest hardness of the two metals by more than 80%. When the two metals with weldability are welded, strength of bonding between the third metal layer and the first metal layer can be improved.

In a possible implementation, a material of the third metal layer is a titanium alloy, and a material of the first metal layer is a material weldable to the third metal layer (that is, the titanium alloy); or a material of the first metal layer is a titanium alloy, and a material of the third metal layer is a material weldable to the first metal layer (that is, the titanium alloy).

In a possible implementation, in a process of manufacturing the first cover, a first hole is provided on a first cover body forming the first cover. In a process of manufacturing the second cover, a second hole is provided on a second cover body forming the second cover. In a process of combining the first cover with the second cover, a sealing structure is formed between the first hole and the second hole. The sealing structure is connected to the first cover body and the second cover body, to jointly enclose the closed cavity. At the sealing structure, the first hole is connected to the second hole to form a through hole that penetrates through the vapor chamber.

In a specific manufacturing process, an architecture of the sealing structure may include but is not limited to the following solutions.

In a first solution, a portion of the sealing structure and the first cover body are an integrated structure, and a portion of the sealing structure and the second cover body are an integrated structure. In a process of combining the first cover with the second cover, the two portions of sealing structures are connected, and sealed and fastened.

In a second solution, the sealing structure and the first cover body are an integrated structure. In a process of combining the first cover with the second cover, an end part that is of the sealing structure and that is away from the first cover body is combined and sealed with, and fastened to an edge of the second hole of the second cover body.

In a third solution, the sealing structure and the second cover body are an integrated structure. In a process of combining the first cover with the second cover, an end part that is of the sealing structure and that is away from the second cover body is combined and sealed with, and fastened to an edge of the first hole of the first cover body.

In a fourth solution, the sealing structure is a single structure independent of the first cover body and the second cover body, and two ends of the sealing structure are in a sealed connection to an edge of the first hole of the first cover body and an edge of the second hole of the second cover body. The sealing structure in this solution may be a sleeve-like structure, a flexible sheet-like structure, or a paste-like structure.

In a process of manufacturing a hole on the first cover body and a hole on the second cover body, the first hole and the second hole may be opposite, that is, a plane on which the first cover body is located is used as a reference plane, and the first hole and the second hole are opposite in a direction perpendicular to the reference plane. Alternatively, the first hole and the second hole may be disposed in a staggered manner. In this way, the formed through hole of the vapor chamber is inclined, that is, an included angle between an extension direction of the through hole of the vapor chamber and the reference plane is less than 90°.

In a possible implementation, in a process of combining the first cover with the second cover, the method further includes: fixedly connecting two ends of the connection structure in the closed cavity to the first cover and the second cover respectively. This avoids a problem that the first cover and the second cover easily interfere with another component due to deformation such as bulging and warping after the vapor chamber is heated.

According to a third aspect, this application provides a middle frame assembly. The middle frame assembly includes a middle frame, connectors, and a vapor chamber. A through hole is provided on the middle frame, the connectors are fixedly connected to the middle frame, and some of the connectors are exposed to form a welding part. The welding part is located on an inner wall of the through hole or a surface of the middle frame used to carry a component in an electronic device. The vapor chamber includes a vapor chamber body and a surrounding edge surrounding the vapor chamber body. The vapor chamber is accommodated in the through hole, and the surrounding edge is welded to the connectors, so that the vapor chamber is combined with the middle frame as a carrying part in the electronic device. The connectors and the surrounding edge are metal materials of a same type, or the connectors and the surrounding edge are metal materials of different types that have weldability. The metal materials of a same type mean that elements with highest content in the metal materials are the same. When the metal materials of the same type are welded, no brittle phase is generated, so that the metal materials of the same type have high welding strength. Weldability means that elements with highest content are different, a burning loss temperature of a metal with a low melting point is less than a melting point of a metal with a high melting point, no brittle phase is generated in a bonding region of the two metals, and hardness of a welding part is greater than the lowest hardness of the two metals by more than 80%.

In this application, the connectors are integrated with the middle frame, and the connectors and the vapor chamber are welded, to implement a high-strength and ultra-thin connection between the middle frame and the vapor chamber, and enable good thermal conduction performance between the vapor chamber and the middle frame. Specifically, edges of the middle frame and the vapor chamber are usually made of different materials, and the middle frame and the vapor chamber that are made of different materials are directly welded, so that a brittle phase is easily generated, which is unfavorable to improvement on strength of bonding between the middle frame and the vapor chamber. The conventional middle frame and the vapor chamber may also be combined in a pasting manner, resulting in poor heat transfer performance and limited strength of bonding. In this application, the connector is used as a transition mechanical part between the middle frame and the vapor chamber. The connector is fastened to the middle frame, and the connector is welded with the surrounding edge of the vapor chamber. Because the connectors and the surrounding edge of the vapor chamber are metal materials of a same type, or the connectors and the surrounding edge are metal materials of different types that have weldability, during welding, the connectors and the vapor chamber can have high welding strength, and strength of bonding between the vapor chamber and the middle frame is improved. In addition, the vapor chamber is located at the through hole of the middle frame. Therefore, a thickness of the middle frame is not increased or less increased, and an ultra-thin connection between the middle frame and the vapor chamber is implemented. The connector is made of a metal material, and the vapor chamber is connected to the middle frame by using metal. This helps thermal conduction between the vapor chamber and the middle frame.

In a possible implementation, the vapor chamber is the vapor chamber in any possible implementation of the first aspect, and the edge region of the first metal layer is combined with an edge of the third metal layer to form the surrounding edge. In another implementation, the vapor chamber may alternatively be a vapor chamber in another structure form. This is not limited in this application.

In a possible implementation, a first limiting structure is formed at a joint between the connector and the middle frame, to implement limiting in a first direction. The connector and the surrounding edge are welded to form a second limiting structure, to implement limiting in a second direction. The first direction and the second direction are opposite directions. When the connector and the middle frame are combined in an embedding manner, the connector easily falls off from the middle frame. The first limiting structure is disposed at the joint between the connector and the middle frame, so that the connector can be prevented from falling off in the first direction. The connector and the surrounding edge are welded to form the second limiting structure, so that the connector is prevented from falling off in the second direction. In this application, the first limiting structure and the second limiting structure work together, so that the connector is more securely combined between the middle frame and the vapor chamber, and the middle frame assembly can be thinned. Specifically, a portion of the middle frame used to combine with the connector does not need to be very thick. In a case of a thinned middle frame structure, the first limiting structure and the second limiting structure can compensate for insufficient strength of the thin middle frame, so that strength of the middle frame assembly is ensured. In this case, the connector is securely and reliably combined with the middle frame.

In a possible implementation, the connector is embedded into the middle frame. The connector includes a first end surface and a second end surface that are opposite to each other and a side surface connected between the first end surface and the second end surface. The side surface is located in the middle frame, the second end surface is exposed on a surface of the middle frame, and an exposed portion of the second end surface is used as a welding part. The welding part is configured to weld with the surrounding edge. The first end surface may alternatively be exposed on the surface of the middle frame, and the first end surface may alternatively be located in the middle frame. For example, the middle frame is injection-molded and covered by using plastic to form a plastic layer at a bottom of the first end surface. In this way, the first end surface is not exposed on the surface of the middle frame.

In a possible implementation, the first limiting structure is located on the first end surface of the connector. The second limiting structure is located on the second end surface of the connector. The first limiting structure includes a position-limiting pin formed on the first end surface of the connector and a position-limiting step formed on the middle frame. The position-limiting pin is located on a side that is of the position-limiting step and that is away from the second limiting structure, and is fixedly lapped on the position-limiting step. The position-limiting step is configured to prevent the connector from falling off in the first direction.

In a possible implementation, the first limiting structure is formed on the side surface. The second limiting structure is located on the second end surface of the connector. The first limiting structure includes a concave part formed on the side surface of the connector and a protrusion part formed on the middle frame, and the protrusion part cooperates with the concave part. The protrusion part and the concave part cooperate with each other, so that the connector is clamped on the middle frame. In this way, the connector is prevented from falling off in the first direction.

In a possible implementation, the first limiting structure and the second limiting structure are located on the second end surface. The side surface is connected to the second end surface through a limiting surface. The limiting surface is an inclined surface extending obliquely relative to the second end surface, and the second end surface is used to weld with the surrounding edge. The first limiting structure includes the limiting surface and a limiting part that is of the middle frame and that cooperates with the limiting surface. The limiting part is fixedly connected between the surrounding edge and the limiting surface.

In a possible implementation, the connector is combined on a surface of the middle frame by thermal diffusion or hot stack rolling, and the connector is clamped between the middle frame and the surrounding edge, so that the first limiting structure and the second limiting structure are combined to implement limiting in the first direction and the second direction. The connector may be combined with the middle frame in an embedding manner. Alternatively, the connector may be located on the surface of the middle frame, one side is fixedly connected to the middle frame, and the other side is fixedly connected to the vapor chamber, to implement bidirectional limiting in the first direction and the second direction.

In a possible implementation, an inner side wall that is of the middle frame and that faces the through hole includes at least two mounting surfaces, and the connector includes at least two connection surfaces, so that the at least two connection surfaces of the connector are respectively combined with the at least two mounting surfaces. The at least two connection surfaces of the connector may be separately combined with the at least two mounting surfaces of the middle frame by thermal diffusion. The connection surfaces of the connector and the mounting surfaces of the middle frame are welded by thermal diffusion, so that there is a clear boundary line at the joint between the connector and the middle frame, and there is no heat-affected region. A size of a composite region of the connector and the middle frame is less than or equal to 0.1 mm, which facilitates thermal conduction.

In a possible implementation, the middle frame includes at least two sub-frame parts, and there are at least two connectors that are in a strip-like layout. The at least two connectors are correspondingly combined on the at least two sub-frame parts respectively, and the at least two sub-frame parts are spliced into the middle frame. The middle frame may be of a split structure. The at least two connectors are separately fastened to the at least two sub-frame parts, and the at least two split sub-frame parts are spliced to form the middle frame. This can improve material utilization and reduce costs.

In a possible implementation, the middle frame is of an integrated frame structure. The connectors include a first connector and a second connector, and the first connector and the second connector are in a strip-like layout. The first connector and the second connector that are in a strip-like layout are respectively fastened to the middle frame of the integrated structure, so as to combine the connectors with the middle frame.

In a possible implementation, the through hole is a step-shaped through hole, and an inner wall of the through hole includes a step surface. The connector is embedded into the middle frame. The welding part is located on the step surface, and the surrounding edge is lapped on the step surface and welded to the welding part. The connector and the middle frame may be combined in an embedding manner. The embedding direction may be a direction perpendicular to a plane on which the middle frame is located, or may have a specific angle with a direction of a plane on which the middle frame is located. When there are a plurality of connectors, the embedding directions of the plurality of connectors may be the same or different, and may be set according to a requirement.

In a possible implementation, the through hole is a straight through hole, and an inner wall of the through hole faces the inside of the through hole. The welding part is located on the inner wall of the through hole, the surrounding edge is bent relative to the vapor chamber body, and the connector is embedded into the middle frame. The connector extends from an outer edge of the middle frame to the inner wall of the through hole. An appearance feature of the vapor chamber is not limited to a planar shape, and may alternatively be a curved surface shape or a special shape, which is specifically set according to an appearance feature of the middle frame.

In a possible implementation, the middle frame is provided with a lap surface. The lap surface is a surface of the middle frame used to carry a component in an electronic device. The welding part is located on the lap surface, and the surrounding edge is lapped on the lap surface, and welded to the welding part on the lap surface.

In a possible implementation, there are a plurality of second limiting structures between the connectors and the vapor chamber. The connectors are in a one-to-one correspondence with the second limiting structures, that is, one second limiting structure is disposed on each connector. A weld joint is formed on the second limiting structure, and each second limiting structure may correspond to one or more weld joints. The connector may be a rivet, an embedded metal plate, a screw, a plate, or the like. When the connector is a connector that needs to be embedded and fastened, such as the rivet or the screw, an embedding process may be performed as required. For example, a hole may be disposed on the middle frame, the rivet may be riveted into the hole, or the screw may be screwed into the hole. A shape, size, and quantity of the rivet or the screw are not limited. The rivet may be riveted into any position of the middle frame, so as to cooperate with the vapor chamber in position.

In a possible implementation, there are a plurality of second limiting structures between the connectors and the vapor chamber. The connectors are in a long strip shape, and each connector corresponds to at least two of the second limiting structures. When there are a plurality of connectors, each connector may correspond to one or more second limiting structures. The plurality of connectors may be combined with the middle frame in different manners. The plurality of connectors may be embedded into the middle frame, or may be located on a surface of the middle frame. Specifically, the plurality of connectors and the middle frame may be disposed according to a product requirement.

In a possible implementation, the vapor chamber is of a square or polygonal architecture, a shape of the through hole matches the vapor chamber, and at least one connector is correspondingly disposed on the surrounding edge at each edge of the vapor chamber. In a possible implementation, the surrounding edge of the vapor chamber is made of a copper alloy or stainless steel, and the middle frame is made of a titanium alloy or an aluminum alloy.

According to a fourth aspect, this application provides a manufacturing method of a middle frame assembly, including: manufacturing a middle frame, where in a process of fixedly connecting connectors made of a material different from that of the middle frame to the middle frame, the middle frame is provided with a through hole, some of the connectors are exposed to form a welding part, and the welding part is located on an inner wall of the through hole or a surface that is of the middle frame and is used to carry a component in an electronic device; providing a vapor chamber, where the vapor chamber includes a vapor chamber body and a surrounding edge surrounding the vapor chamber body, the surrounding edge and the connectors are metal materials of a same type, or the surrounding edge and the connectors are metal materials of different types that have weldability; mounting the vapor chamber to the middle frame, placing the vapor chamber at the through hole of the middle frame, and welding the surrounding edge and the welding part of the connectors.

In this application, the middle frame provided with the through hole is manufactured, and the vapor chamber is mounted in the through hole. Specifically, the connector is used to connect the middle frame and the vapor chamber, and the connector is welded to the surrounding edge of the vapor chamber, to implement a high-strength and ultra-thin connection between the middle frame and the vapor chamber, and enable good thermal conduction performance between the vapor chamber and the middle frame.

In a possible implementation, a manufacturing method of a vapor chamber is the same as the manufacturing method of a vapor chamber in various specific implementations of the second aspect. Details are not described again. In another possible implementation, the vapor chamber may alternatively be formed by using another manufacturing method. This is not limited in this application.

In a possible implementation, in a process of manufacturing the middle frame, the connector and the middle frame are integrated in an embedding manner.

In a possible implementation, a step of manufacturing the middle frame includes: providing a billet for manufacturing the middle frame; embedding the connectors into the billet; and machining the billet to form the middle frame with a through hole, where some of the connectors are exposed on a surface of the middle frame.

In a possible implementation, after the middle frame with the through hole is formed, anodic oxidation is performed, and a material of the connector is a titanium alloy. The titanium alloy has good corrosion resistance, and is not easily corroded in a process of anodic oxidation. The connector may alternatively be made of another corrosion-resistant material.

In a possible implementation, a step of manufacturing the middle frame includes: providing a billet for manufacturing the middle frame; machining the billet to form the middle frame with a through hole; and embedding the connectors into the middle frame, where some of the connectors are exposed on a surface of the middle frame.

In a possible implementation, after the middle frame with the through hole is formed, anodic oxidation is performed on the middle frame, and the connector is embedded after the anodic oxidation. Because the connector is embedded after the anodic oxidation, a material of the connector is less limited. For example, the material of the connector may be a plurality of materials such as a titanium alloy and stainless steel.

In a possible implementation, the connector is embedded into the middle frame by riveting or threaded screwing.

In a possible implementation, the connector is integrated with the middle frame by thermal diffusion or hot pack rolling. The combination of thermal diffusion or hot stack rolling can make the connector and the middle frame have strong strength of bonding.

In a possible implementation, a step of manufacturing the middle frame includes: manufacturing a composite billet, and combining a middle frame billet with a connector billet by thermal diffusion, where the middle frame billet and the connector billet are different materials; performing heat treatment on the composite billet, and performing solution treatment and aging treatment, so that the middle frame billet is combined with the connector billet; and machining the heat-treated composite billet to form the middle frame with the through hole, where some of the connectors are exposed on a surface of the middle frame.

In a possible implementation, in a process of preparing the composite billet, an integrated middle frame billet is combined with the connector billet by thermal diffusion.

In a possible implementation, in a process of preparing the composite billet, at least two middle frame billets are combined with the connector billet by thermal diffusion to form at least two composite plates. The at least two composite plates are cut and machined to obtain at least two sub-frame parts, and then the at least two sub-frame parts are spliced to form the middle frame. Specifically, the frame body of the middle frame may be spliced in a plastic injection molding manner or a welding manner.

In a possible implementation, a step of manufacturing the middle frame includes: providing an integrated middle frame billet and at least two connector billets, where a material of the middle frame billet is different from a material of the connector billet; processing the middle frame billet to form a frame structure; preparing a composite billet, and combining the middle frame billet with the at least two connector billets by thermal diffusion; performing heat treatment on the composite billet, and performing solution treatment and ageing treatment on the composite billet, so that the middle frame billet is combined with the connector billets; and machining the heat-treated composite billet to form the middle frame with the through hole, where some of the connectors are exposed on a surface of the middle frame.

In a possible implementation, in a process of manufacturing the middle frame, a protective film is formed on a surface of the middle frame through spraying, vapor nonconductive coating, physical vapor deposition, or chemical vapor deposition to protect the middle frame. Because anodic oxidization treatment is not required, a material of the connector may be a plurality of materials such as a titanium alloy and stainless steel.

According to a fifth aspect, this application provides an electronic device. The electronic device includes a heat emitting part and the middle frame assembly according to any one of the implementations of the third aspect. The heat emitting part is correspondingly disposed in a region of the vapor chamber of the middle frame assembly.

According to a sixth aspect, this application provides an electronic device, including a middle frame, connectors, a vapor chamber, and an electronic component. The connectors are fixedly connected to the middle frame, and some of the connectors are exposed on a surface of the middle frame to form a welding part. The vapor chamber includes a vapor chamber body and a surrounding edge surrounding the vapor chamber body, where the surrounding edge is welded to the connectors, so that the vapor chamber and the middle frame are combined as a carrying part in the electronic device. The connectors and the surrounding edge are metal materials of a same type, or the connectors and the surrounding edge are metal materials of different types that have weldability. The electronic component is disposed on the vapor chamber.

In a possible implementation, the middle frame is provided with a first through hole, the welding part is an inner wall of the through hole or a surface that is of the middle frame and that is configured to carry the electronic component, and the vapor chamber is located at the first through hole. The vapor chamber, the middle frame, and the connectors jointly form a middle frame assembly, and the vapor chamber is provided with a second through hole. The electronic device further includes a flexible circuit board, and the flexible circuit board passes through the second through hole, and the flexible circuit board is distributed on two opposite sides of the middle frame assembly. The first through hole of the middle frame in this implementation has a same meaning as the through hole of the middle frame in the middle frame assembly structure in the third aspect, and the second through hole on the vapor chamber in this implementation has a same meaning as the through hole on the vapor chamber in the first direction. For distinguishing description, "first through hole" and "second through hole" are used herein for differentiation.

In a possible implementation, a first limiting structure is formed at a joint between the connector and the middle frame, to implement limiting in a first direction. The connector and the surrounding edge are welded to form a second limiting structure, to implement limiting in a second direction. The first direction and the second direction are opposite directions.

In a possible implementation, the vapor chamber includes a first cover and a second cover. The second cover includes a first metal layer and a second metal layer. The first metal layer includes a main body region and an edge region surrounding the main body region. The second metal layer overlaps the main body region, the edge region is configured to combine with an edge of the first cover to form a closed cavity between the first cover and the second cover. The second metal layer is located in the closed cavity. A wick structure is formed on a surface of the second metal layer, material strength of the first metal layer is greater than material strength of the second metal layer, and the edge region of the first metal layer is combined with an edge of the first cover to form the surrounding edge.

In a possible implementation, a material of the first metal layer is a titanium alloy or stainless steel.

In a possible implementation, a material of the middle frame is an aluminum alloy or a magnesium alloy.

For specific beneficial effects of the sixth aspect and the possible implementations of the sixth aspect, refer to specific descriptions of the first aspect to the fifth aspect. Details are not described again.

BRIEF DESCRIPTION OF DRAWINGS

The following describes some accompanying drawings in embodiments of this application.

DESCRIPTION OF EMBODIMENTS

To describe the technical solutions in embodiments of this application or in the background more clearly, the following briefly describes the accompanying drawings for describing embodiments of this application or the background.

Figure 1:
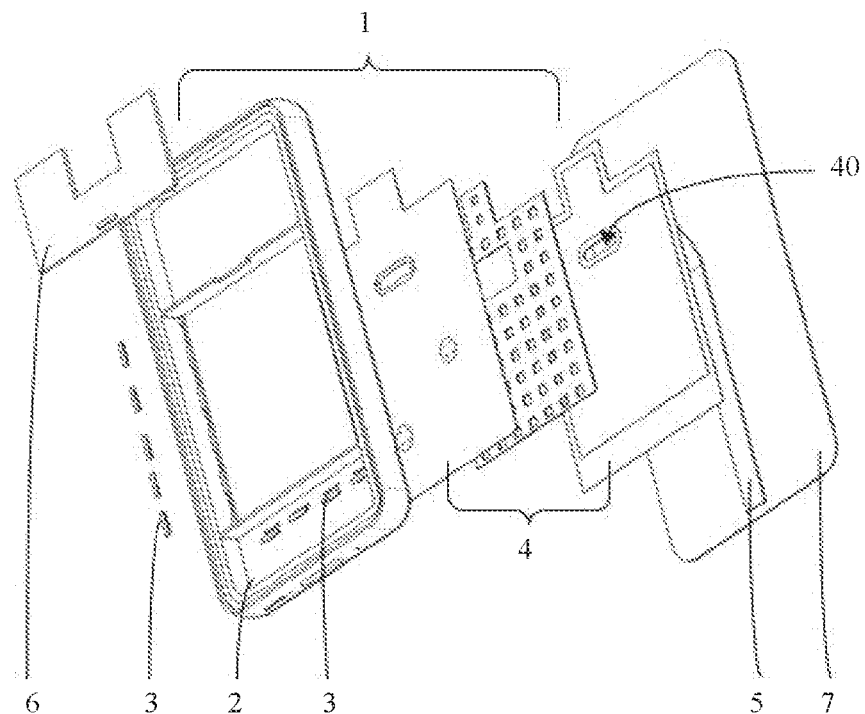
FIG. 1 is a schematic diagram of an application environment of a middle frame assembly according to an implementation of this application.
Figure 2:
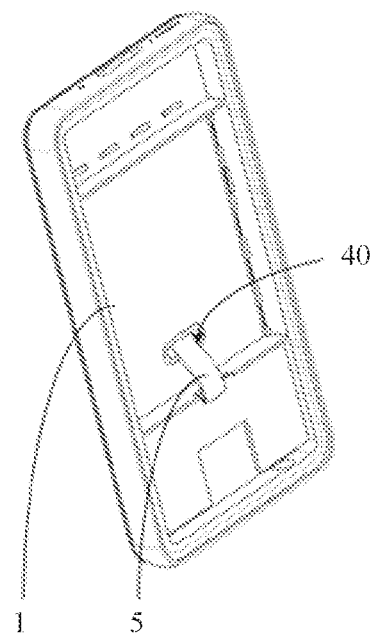
FIG. 2 is a schematic diagram of a structure of an assembled middle frame assembly according to an implementation of this application.

This application provides a vapor chamber and a manufacturing method thereof, a middle frame assembly and a manufacturing method thereof, and an electronic device. The electronic device may be an electronic device such as a mobile phone, a tablet computer, a notebook computer, a wearable product, or a smart home terminal. A mobile phone is used as an example. As shown in FIG. 1 and FIG. 2, FIG. 1 is a schematic three-dimensional exploded diagram of an electronic device. FIG. 2 is a schematic three-dimensional diagram of an assembled electronic device, where the electronic device includes a middle frame assembly 1, a display component 7, a flexible circuit board 5, a printed circuit board 6, and other structures (for example, a battery, a mainboard, an antenna, and a camera module) that are not shown in the figure. The middle frame assembly 1 is a main carrying part in the electronic device. The middle frame assembly 1 may be a carrier configured to carry an internal component of the electronic device. One side of the middle frame assembly 1 is configured to mount a display component, and the other side is configured to mount a component such as a battery or a circuit board. The middle frame assembly 1 includes a middle frame 2, connectors 3, and a vapor chamber 4. The vapor chamber 4 is mounted at a through hole of the middle frame 2 by using the connectors 3, and the vapor chamber 4 may be embedded into the through hole, so that the middle frame assembly is small enough in thickness. In this way, the electronic device can be thinned. The vapor chamber 4 may alternatively be mounted on a surface of the middle frame 2, or a portion of the vapor chamber 4 may be sunk into the through hole of the middle frame. "Partially sunk" may be understood as follows: A portion of the vapor chamber 4 is in the through hole, and a portion of the vapor chamber 4 is located outside the through hole.

In the embodiment shown in FIG. 1, some of the connectors 3 are decomposed from the middle frame 2 to form an exploded view. Some of the connectors 3 are connected to the middle frame 2, and some connectors 3 are blocked by the middle frame 2 and are not displayed. It can be understood that connectors 3 are disposed on four sides of the vapor chamber 4.

Specifically, the connectors 3 and the middle frame 2 are integrated, and the vapor chamber 4 and the connectors 3 are welded and fastened. A through hole 40 is disposed on the vapor chamber 4, the flexible circuit board 5 passes through the through hole 40 of the vapor chamber 4 and is connected to the printed circuit board 6. The flexible circuit board 5 may implement an electrical connection between the printed circuit board 6 and the display component 7 that are separately located on two sides of the middle frame assembly 1. In this application, the vapor chamber 4 and the middle frame 2 may be welded by using the connectors 3 to implement a high-strength connection between the middle frame 2 and the vapor chamber 4. When connection strength is high, the middle frame assembly 1 may be thinner, that is, a strength problem of a small thickness is compensated for by using the connection strength, so that strength and connection reliability of a structure can still be ensured when the electronic device is integrally thinned. The middle frame 2, the connectors 3, and the vapor chamber 4 in the middle frame assembly provided in this application are all made of metal materials, so that the middle frame assembly 1 has good thermal conduction performance.

Next, a structure of the vapor chamber, a manufacturing method of the vapor chamber, and a structure and a manufacturing method of the middle frame assembly are separately described from three aspects.

According to a first aspect, a structure of a vapor chamber is as Mows.

Figure 3:
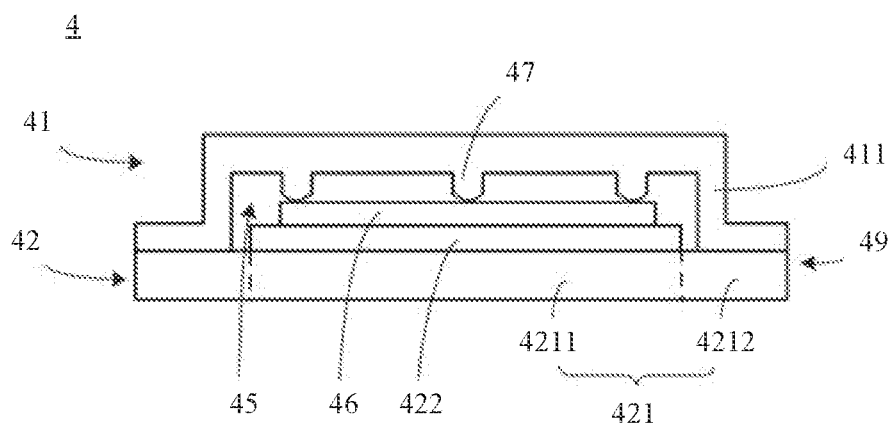
FIG. 3 is a schematic diagram of a structure of a vapor chamber according to an implementation of this application.

FIG. 3 is a schematic cross-sectional diagram of a structure of a vapor chamber 4 in an implementation of this application. As shown in FIG. 3, the vapor chamber 4 includes a first cover 41 and a second cover 42. The second cover 42 is a composite plate layer. The second cover 42 includes a first metal layer 421 and a second metal layer. The second metal layer may be a copper layer. For ease of description, the second metal layer is replaced with a copper layer 422 subsequently. The first cover 41 includes a third metal layer 411, and the first metal layer 421 includes a main body region 4211 and an edge region 4212 surrounding the main body region 4211. The copper layer 422 overlaps the main body region 4211 (that is, the copper layer 422 is disposed on a surface of the main body region 4211, and the edge region 4212 is not covered by the copper layer 422), and the edge region 4212 is configured to combine with an edge of the third metal layer 411, to form a closed cavity 45 between the first cover 41 and the second cover 42. The copper layer 422 is located in the closed cavity 45, and a wick structure 46 is formed on a surface of the copper layer 422. Strength of a material of the third metal layer 411 is greater than strength of a material of the copper layer 422, and strength of a material of the first metal layer 421 is greater than strength of a material of the copper layer 422.

In this application, the strength of the material of the third metal layer 411 forming the vapor chamber 4 is limited to be greater than the strength of the material of the copper layer 422, and the strength of the material of the first metal layer 421 is greater than the strength of the material of the copper layer 422, so that the vapor chamber 4 integrally has a high-strength characteristic. It can be understood that the vapor chamber 4 has good strength provided that the strength of the first metal layer 421 is greater than the strength of the copper layer 422. Material strength of the third metal layer 411 is greater than material strength of the copper layer 422, so that the vapor chamber 4 has good strength.

The wick structure 46 of the vapor chamber 4 provided in this application is still formed by sintering the copper layer, so that problems of difficult molding and a low yield of the wick structure on another metal material can be avoided. This implements a function of enhancing structural strength and heat dissipation performance of the vapor chamber.

A working principle of the vapor chamber 4 provided in this application is as follows: A heat emitting part is disposed in a partial region of the vapor chamber 4, and a thermally conductive working medium (for example, water) is disposed in the closed cavity 45 in the vapor chamber 4. When the heat emitting part works, heat is emitted, and a region in which the vapor chamber 4 is in contact with the heat emitting part absorbs heat, so that the thermally conductive working medium in the vapor chamber 4 is gasified due to heat, that is, water changes from a liquid state to a gas, and the gas flows to another region of the vapor chamber in the cavity. In a region in which the vapor chamber is far away from the heat emitting part, the gas is liquefied into a liquid due to a low temperature, and the liquid is adsorbed on the wick structure and transmitted to the region in which the heat emitting part is located. In this way, gas-liquid two-phase circulation is formed, and an effect of temperature equalization is achieved.

A support cradle 47 is further disposed in the vapor chamber 4. The support cradle 47 is configured to support, between the first cover and the second cover, the closed cavity 45 in the vapor chamber. The support cradle 47 may also enhance strength of the vapor chamber 4. There may be a plurality of support cradles 47. The support cradles 47 are specifically arranged according to a size and a shape of the vapor chamber 4. For example, the support cradles 47 may be distributed in an array of three rows and five columns, or the support cradles 47 may alternatively be distributed irregularly in the vapor chamber 4. More support cradles 47 may be distributed in a central region of the vapor chamber 4, and fewer support cradles 47 may be distributed in a region close to a surrounding edge. It may also be understood that density of the support cradles 47 in the central region is high, and density of the support cradles 47 in an edge region is low. A specific form of the support cradle 47 is not limited to a cylindrical structure, and the support cradle 47 may alternatively be of a strip structure.

Figure 4:
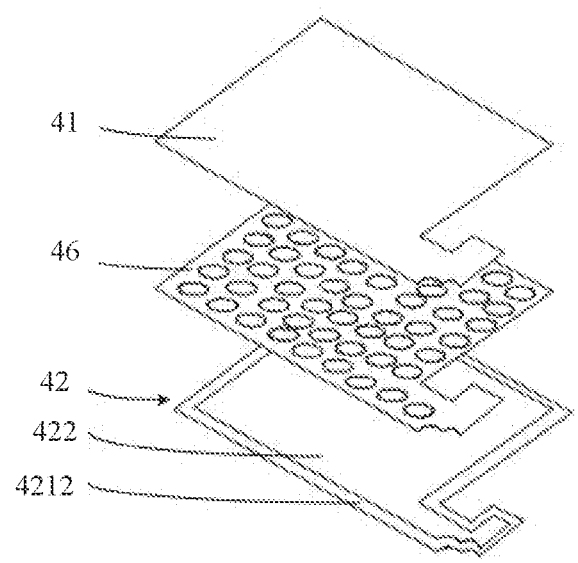
FIG. 4 is a structural diagram of a vapor chamber before assembling according to an implementation of this application.

As shown in FIG. 4, the first cover 41 and the second cover 42 are stacked oppositely, and the wick structure 46 is stacked between the first cover 41 and the second cover 42. In a manufacturing process, the wick structure 46 is formed on the copper layer 422 of the second cover 42, and then an edge of the first cover 41 and the edge region 4212 of the second cover 42 are combined to form the vapor chamber 4. The wick structure 46 shown in FIG. 4 is integrated with the copper layer 422 in an actual product. To facilitate expression of a position relationship between the copper layer 422 and the wick structure 46, the wick structure 46 is separated from the copper layer 422 in FIG. 4 for expression. A representation form in FIG. 4 does not represent a specific form of a wick structure in a specific product.

Another protective layer may alternatively be disposed on an outer surface (that is, a surface that is of the third metal layer 411 and that is away from the second cover 42) of the third metal layer 411. The third metal layer 411 in the first cover 41 may be a titanium alloy plate layer. The third metal layer 411 may be an α-type titanium alloy such as a TA1, TA2, or TA4 material, or may be an α-β-type titanium alloy such as TC4, or may be a beta-type titanium alloy such as TB2.

For the second cover 42, the first metal layer 421 has strong strength, and is used as a main body that implements a main supporting effect. A thickness of the first metal layer 421 is greater than a thickness of the copper layer 422. Specifically, the thickness of the copper layer 422 is less than 0.15 mm, and a function of the copper layer 422 is to make the wick structure 46, provided that copper powder or a copper mesh can be placed on the copper layer 422 and sintered to form the wick structure 46, Therefore, the copper layer 422 may be thin, which helps reduce a thickness of the vapor chamber 4. In addition, when the copper layer 422 is thin, larger space may be reserved in the cavity 45 to inject more working medium (for example, the working medium may be water), which helps improve heat dissipation performance of the vapor chamber 4. In a preferred implementation, the copper layer 422 may be copper metal with a thickness of 0.05 mm. According to an actual product requirement, the copper layer 422 of another thickness and material may alternatively be selected.

The third metal layer 411 may be a titanium alloy with a thickness of 0.1 mm, and the first metal layer 421 may be a titanium alloy with a thickness of 0.2 mm. Based on an actual product requirement, the third metal layer 411 and the first metal layer 421 that are of another thickness and material may alternatively be selected, so that the vapor chamber 4 has good strength and thermal conduction performance.

The edge region 4212 of the first metal layer 421 may be in a sealed connection to an edge of the third metal layer 411 by welding. Welding and sealing can ensure strength of bonding between the first metal layer 421 and the third metal layer 411, to prevent leakage of a liquid working medium in a cavity. During welding, there is a problem of welding strength. To enable the vapor chamber 4 to have good welding strength, a material of the third metal layer 411 and a material of the first metal layer 421 may be metal materials of a same type. The metal materials of the same type mean that the material of the third metal layer 411 is the same as an element with highest content in the material of the first metal layer 421. For example, both the material of the third metal layer 411 and the material of the first metal layer 421 may be a titanium alloy. Alternatively, both the material of the third metal layer 411 and the material of the first metal layer 421 may be stainless steel. The material of the third metal layer 411 and the material of the first metal layer 421 may be another high-strength metal material. When the metal materials of the same type are welded, no brittle phase is generated, so that the metal materials of the same type have high welding strength.

In a possible implementation, the material of the third metal layer 411 and the material of the first metal layer 421 may alternatively be metal materials of different types that have weldability. Weldability means that elements with highest content are different, a burning loss temperature of a metal with a low melting point is less than a melting point of a metal with a high melting point, no brittle phase is generated in a bonding region of the two metals, and hardness of a welding part is greater than the lowest hardness of the two metals by more than 80%. When a metal material with weldability is welded, high strength of bonding can be implemented. Specifically, the material of the third metal layer 411 may be a titanium alloy, and the material of the first metal layer 421 is a material weldable to the third metal layer 411; or the material of the first metal layer 421 is a titanium alloy, and a material of the third metal layer 411 is a material weldable to the first metal layer 421.

Figure 5:
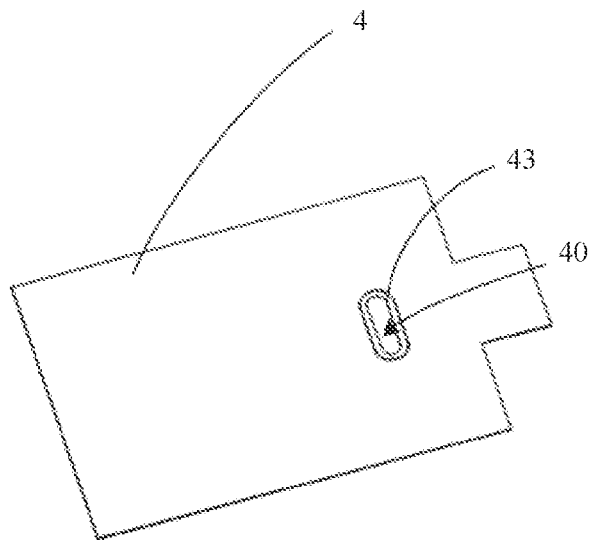
FIG. 5 is a structural diagram of an assembled vapor chamber according to an implementation of this application.

FIG. 5 is a schematic diagram of a vapor chamber 4 according to an implementation of this application. As shown in FIG. 5, the vapor chamber 4 is provided with the through hole 40, and the through hole 40 penetrates through a top surface and a bottom surface of the vapor chamber 4. For example, a surface shown in FIG. 5 is the top surface of the vapor chamber 4, and the top surface and the bottom surface of the vapor chamber 4 may be considered as an outer surface of the first cover 41 and an outer surface of the second cover 42, that is, the through hole 40 penetrates through the first cover 41 and the second cover 42. The through hole 40 is configured to allow a transmission line to pass through. For example, the transmission line may be a flexible circuit board, and the flexible circuit board passes through the through hole 40 and is connected to a printed circuit board. The through hole 40 is disposed on the vapor chamber 4 by holing the first cover 41 and the second cover 42. The hole is located at a closed cavity of the vapor chamber 4. A sealing structure 43 is disposed at the hole; so as to implement a sealed connection between the sealing structure 43 and the first cover 41 and the second cover 42. This ensures sealing of a vapor closed cavity of the vapor chamber 4.

The sealing structure 43 may have different structures. The following describes six specific implementations as follows.

Figure 6:
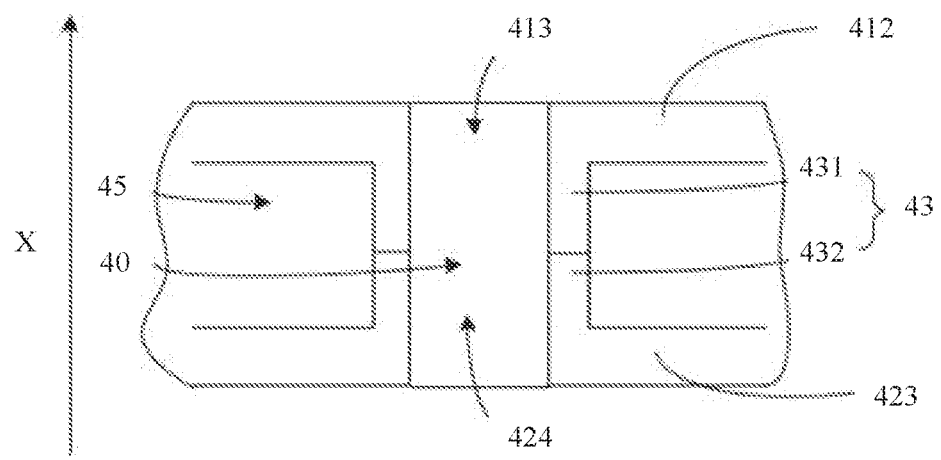
FIG. 6 is a schematic diagram of a structure of a sealing structure according to an implementation of this application.

First implementation: As shown in FIG. 6, the first cover includes a first cover body 412. The second cover includes a second cover body 423. The sealing structure 43 may include two portions: a first boss 431 and a second boss 432. The first boss 431 is a structure integrally formed with the first cover body 412, and the first boss 431 is formed on a periphery of the first hole 413 (that is, an edge of the first hole 413) of the first cover body 412 of the first cover, the second boss 432 is a structure integrally formed with the second cover body 423, and the second boss 432 is formed on a periphery of the second hole 424 (that is, an edge of the second hole 424) of the second cover body 423 of the second cover. The first boss 431 is connected to the second boss 432, so that the first hole 413 is connected to the second hole 424 to form the through hole 40. The first boss 431 and the second boss 432 may form the sealing structure 43 by welding, to seal the cavity 45.

Figure 7:
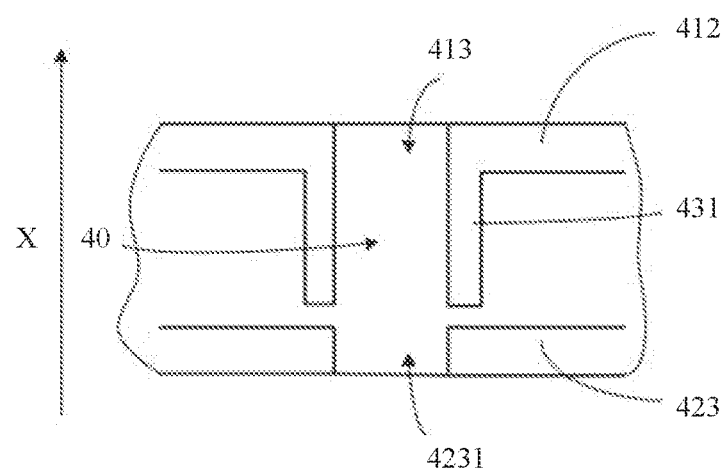
FIG. 7 is a schematic diagram of a structure of a sealing structure according to another implementation of this application.

Second implementation: As shown in FIG. 7, the sealing structure 43 and the first cover body 412 of the first cover 41 may be an integrated structure. Specifically; the sealing structure includes the first boss 431, and the first boss 431 is a structure integrally formed with the first cover body 412. The first boss 431 is formed at an edge of the first hole 413 of the first cover body 412 of the first cover, and the second cover body 423 is provided with a second through hole 4231 (The second through hole 4231 may be considered as a second hole disposed on the second cover body 423. To distinguish the second through hole 4231 from the second hole of the sealing structure in the foregoing first implementation, this through hole is defined as a second through hole in this implementation.). The first boss 431 extends to the second through hole 4231 of the second cover body 423 and is sealed and welded with the second cover body 423 (In FIG. 7, to show that the first boss 431 is a structure integrally formed with the first cover body 412, the first boss 431 is not in contact and sealed with the second cover body 423. In an actual product, the first boss 431 is in contact and sealed with the second cover body 423.), so that the first hole 413 is connected to the second through hole 4231 to form the through hole 40.

Figure 8:
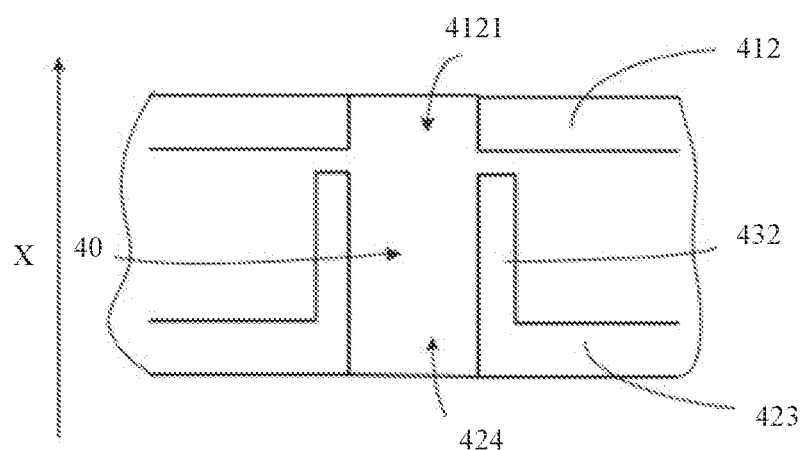
FIG. 8 is a schematic diagram of a structure of a sealing structure according to another implementation of this application.

Third implementation: As shown in FIG. 8, the sealing structure 43 and the second cover body 423 of the second cover 42 may be an integrated structure. Specifically, the sealing structure includes the second boss 432, and the second boss 432 is a structure integrally formed with the second cover body 423. The second boss 432 is provided with the second hole 424 that penetrates through the second cover body 423 of the second cover, and the first cover body 412 is provided with a first through hole 4121 (The first through hole 4121 may be considered as a first hole disposed on the first cover body 412. To distinguish the first through hole 4121 from the first hole of the sealing structure in the foregoing first implementation, this through hole is defined as the first through hole 4121 in this implementation.). The second boss 432 extends to the first through hole 4121 of the first cover body 412, and is sealed and welded with the first cover body 412 (In FIG. 8, to show that the second boss 432 is a structure integrally formed with the second cover body 423, the second boss 432 is not in contact and sealed with the first cover body 412. In an actual product, the second boss 432 is in contact and sealed with the first cover body 412), so that the second hole 424 is connected to the first through hole 4121 to form the through hole 40.

Figure 9:
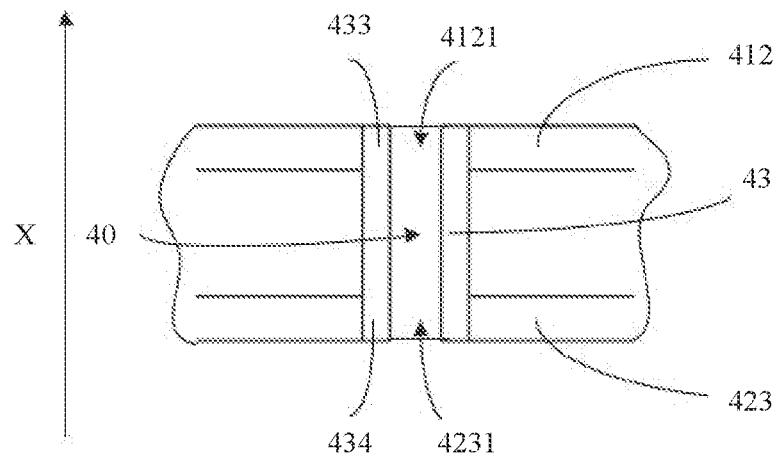
FIG. 9 is a schematic diagram of a structure of a sealing structure according to another implementation of this application.

Fourth implementation: Refer to FIG. 9, the sealing structure 43, the first cover 41, and the second cover 42 are split structures. Specifically, the first cover body 412 is provided with the first through hole 4121, and the second cover body 423 is provided with the second through hole 4231 (The first through hole 4121 and the second through hole 4231 in this implementation have same meanings as the first hole and the second hole in the first implementation, and may be understood as having a same hole structure). The sealing structure 43 forms a hollow channel, and the sealing structure 43 includes a first connection end 433 and a second connection end 434. At an edge of the first through hole 4121, the first connection end 433 is sealed and welded to the first cover body 412. At an edge of the second through hole 4231, the second connection end 434 is sealed and welded with the second cover body 423. The first through hole 4121 and the second through hole 4231 are connected by using the hollow channel of the sealing structure 43 to form the through hole 40. It may also be understood that after the first through hole 4121 is formed on the first cover body 412, and the second through hole 4231 is formed on the second cover body 423. Two ends of the sealing structure 43 are connected to cover bodies at the first through hole 4121 and the second through hole 4231, to seal a cavity by welding.

Fifth implementation: The sealing structure 43 may alternatively be in a sheet shape (This solution is easy to understand, not shown in the figure. The sealing structure 43, the first cover 41, and the second cover 42 in this implementation are also split structures, refer to the figure of the fourth implementation. However, the sealing structure 43 in this implementation may be flexible and the sealing structure 43 defined in the fourth embodiment is not limited to being rigid or flexible). Two ends of the sheet-like sealing structure 43 provided in this implementation respectively surround the first through hole 4121 of the first cover body 412 and the second through hole 4231 of the second cover body 423, and jointly surround a closed cavity. The sheet-like sealing structure may be flexibly disposed in shape because of a flexible feature. This saves space.

Sixth implementation: The sealing structure may also be a paste-like substance (not shown), and a paste-like metal fills up a gap between the first cover body 412 and the second cover body 423 around the first through hole 4121 of the first cover body 412 and the second through hole 4231 of the second cover body 423. A paste-like material is cured by heating and pressurization or thermal diffusion, to form the sealing structure. The paste-like sealing structure may be formed by filling a paste-like substance with some extent of deformation into the gap and curing the paste-like substance.

In the various implementations shown in FIG. 6 to FIG. 9, an inner wall of a through hole enclosed by the sealing structure 43 is smooth. A plane on which the first cover body 412 is located is used as a reference plane, and an extension direction of the through hole 40 is perpendicular to the reference plane.

Figure 10:
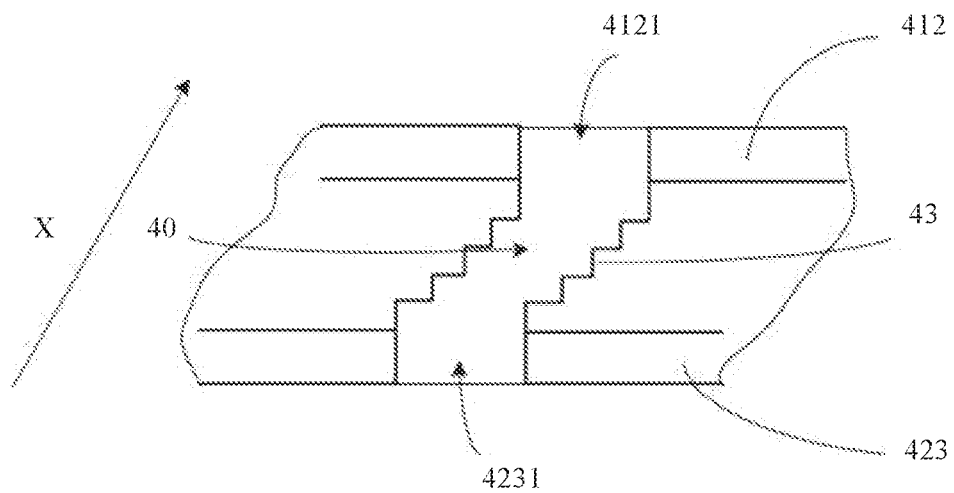
FIG. 10 is a schematic diagram of a structure of a sealing structure according to another implementation of this application.

Refer to FIG. 10. An inner wall of a through hole enclosed by the sealing structure 43 may alternatively be stepped. A shape of the inner wall of the through hole is not limited, provided that the inner wall can allow a transmission line to pass through without affecting performance of the transmission line. In the implementation shown in FIG. 10, an included angle between an extension direction X of the through hole 40 and the reference plane is less than 90°. The extension direction of the through hole 40 may be set according to a requirement. When the included angle between the extension direction of the through hole 40 and the reference plane is less than 90°, that is, the first through hole 4121 and the second through hole 4231 are disposed in a staggered manner, a flexible circuit board passes through the through hole, and a bending angle of the flexible circuit board is also less than 90°. This helps maintain good performance of the flexible circuit hoard and prolong a service life of the flexible circuit board.

Figure 11A:
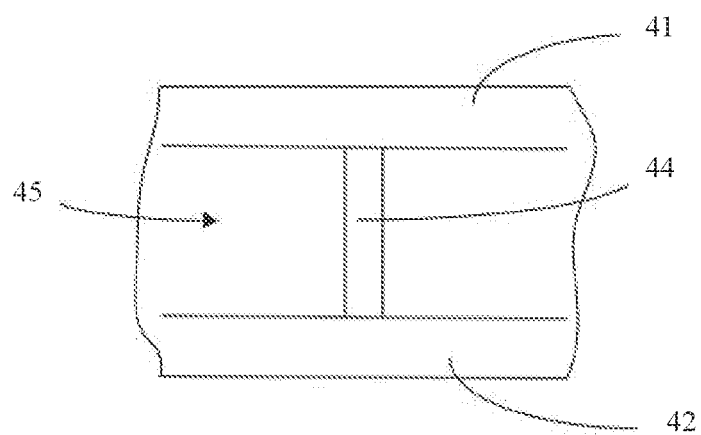
FIG. 11*a* is a schematic diagram of a structure of a connection structure according to an implementation of this application.
Figure 11B:
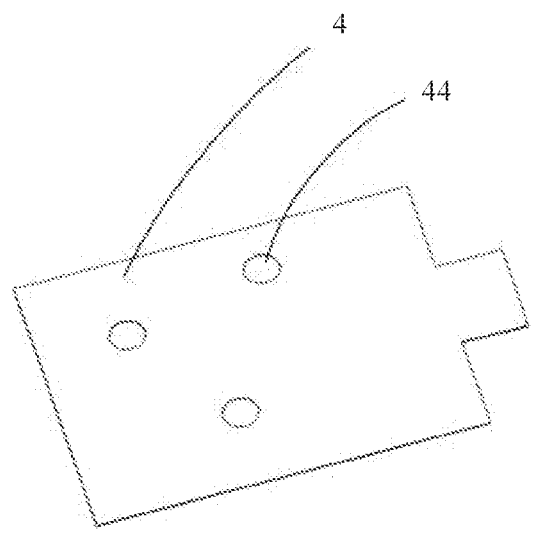
FIG. 11*b* is a schematic diagram of a vapor chamber according to an implementation of this application, and shows a position at which an outer surface of the vapor chamber is welded with a connection structure.

Refer to FIG. 11a and FIG. 11b. The connection structure 44 is disposed in the vapor chamber 4, the connection structure 44 is located in the closed cavity 45, and two ends of the connection structure 44 are fixedly connected to the first cover 41 and the second cover 42, so as to avoid a problem that the first cover 41 and the second cover 42 easily interfere with another component (the another component herein may be an electronic component in an electronic device, or an electronic component that heats up in a working state, and may also be referred to as a heat emitting part) due to deformation such as bulging and warping after the vapor chamber is heated. Generally, the first cover 41 and the second cover 42 are welded and fastened only at an edge, and in a region of an intermediate receptor, there is no fastening structure between the first cover 41 and the second cover 42. If two ends of the connection structure 44 are not fixedly connected to the first cover and the second cover, the first cover and the second cover may be deformed in a case in which the first cover and the second cover are heated. If the two covers are deformed to different degrees, the vapor chamber is burgled or warped. Specifically, the connection structure 44 and the first cover 41 may be an integrated structure, After the first cover 41 and the second cover are connected and fastened, the connection structure 44 and the second cover 42 are welded on an outer surface of the second cover 42. Alternatively, the connection structure and the second cover 42 may be designed as an integrated structure, and the second limiting structure 44 and the first cover are welded on an outer surface of the first cover 41, FIG. 11b shows a welding position formed by welding the connection structure 44 on an outer surface of the vapor chamber 4.

In a specific implementation, the connection structure 44 and the second cover 42 are integrally formed. When forming the connection structure 44, the second cover needs to avoid a region in Which a wick structure needs to be disposed. In a manufacturing process of the wick structure, for example, the wick structure is manufactured by using a copper mesh, an opening is made on the copper mesh used to manufacture the wick structure, so that the connection structure passes through the opening, and the copper mesh covers a surface of the copper layer 422 of the second cover 42, to implement sintering. After the first cover and the second cover are combined, the connection structure and the first cover are fixedly connected by welding on an outer surface of the first cover.

The connection structure 44 is located in the cavity 45, and the connection structure 44 may be disposed in a region close to a center of the cavity. As shown in FIG. 11b, three connection structures are disposed in the middle of the vapor chamber 4, Certainly, there may be more than three connection structures. A specific quantity and location selection depends on a specific size and shape of the vapor chamber. When the vapor chamber 4 has a large area, more connection structures may be disposed.

A liquid working medium exists in the closed cavity 45 of the vapor chamber 4. The liquid working medium may be water, alcohol, acetone, or the like. The liquid working medium is used to implement a continuously cyclical heat dissipation process of the vapor chamber.

According to a second aspect, a manufacturing method of a vapor chamber is as follows.

Figure 12:
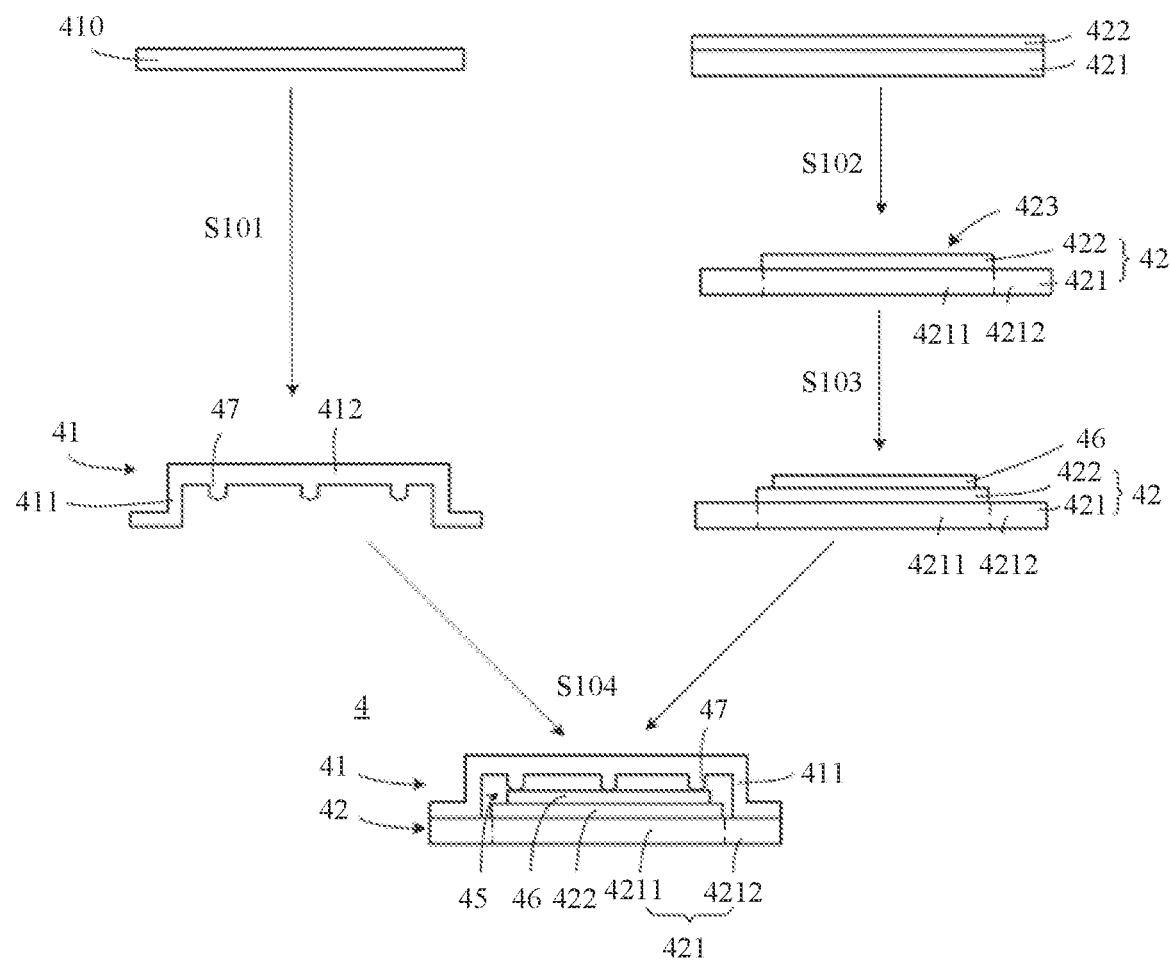
FIG. 12 is a schematic flowchart of a manufacturing method of a vapor chamber according to an implementation of this application.

Refer to FIG. 12, the manufacturing method of a vapor chamber in an implementation specifically includes the following steps.

S101: Manufacture a first cover 41.

Specifically, the first cover 41 includes a third metal layer 411. A plate 410 of the third metal layer may form the first cover 41 in a stamping molding manner. A support cradle 47 is further formed in a process in which the plate 410 of the third metal layer is stamped to form the first cover 41, The support cradle 47 is configured to enhance strength of a vapor chamber 4.

The third metal layer 411 is made of high-strength metal, strength of a material of the third metal layer 411 is greater than strength of a material of a copper metal, and yield strength of the material of the third metal layer 411 is greater than or equal to 330 Mpa. For example, the material of the third metal layer may be a material having high-strength performance, such as a titanium alloy or stainless steel. Specifically, in a preferred implementation, a TA4-M titanium alloy plate with a thickness of 0.1 mm may be stamped to form the first cover 41, or another thickness may be selected according to an actual product requirement. A material of the first cover 41 is not limited to a TA4 titanium alloy, and may alternatively be another titanium alloy, for example, TA1, TA2 or the like in an α-type titanium alloy, or may be a TC4 titanium alloy or the like in an α-β-type titanium alloy, or may be a TB2 titanium alloy or the like in a β-type titanium alloy. Similarly, a stainless steel material may also be selected, for example, 301 stainless steel, 304 stainless steel, or 316 stainless steel, or a high-strength material of another material may be selected.

S102: Manufacture a second cover 42.

The second cover 42 includes a first metal layer 421 and a copper layer 422. Material strength of the first metal layer 421 is greater than material strength of the copper layer 422, The first metal layer 421 includes a main body region 4211 and an edge region 4212 surrounding the main body region 4211, The copper layer 422 overlaps the main body region 4211 (that is, the copper layer 422 is disposed on a surface of the main body region 4211, and the edge region 4212 is not covered by the copper layer 422).

The second cover 42 may be manufactured in different manners. Specifically, the first metal layer 421 and the copper layer 422 may be compounded by electroplating, rolling, thermal diffusion, or the like. The first metal layer 421 and the copper layer 422 have a same size, that is, the first metal layer 421 totally overlaps the copper layer 422. An edge region of the copper layer 422 is removed through etching, and the copper layer 422 in a middle region is retained, so that the copper layer 422 overlaps only the main body region 4211.

S103: Manufacture a wick structure 46.

The copper layer 422 totally covers the main body region 4211 of the first metal layer 421, and the wick structure 46 is manufactured on a surface of the copper layer 422. Specifically, copper powder or a copper mesh is placed on the copper layer 422, and the wick structure 46 is formed in a sintering manner, A thickness, an area, a shape region, a porosity, and the like of the wick structure 46 may be adjusted according to a heat dissipation performance requirement.

S104: Combine the first cover 41 with the second cover 42.

The edge region 4212 of the second cover 42 is fixedly connected to an edge of the third metal layer 411, to form a closed cavity 45 between the first cover 41 and the second cover 42.

Specifically, the edge region 4212 of the second cover 42 and an edge of the first cover 41 are welded by methods such as laser welding, diffusion welding, friction stir welding, or the like, and a liquid injection opening is retained. A liquid working medium is injected into the cavity 45 of the vapor chamber 4 through the liquid injection opening, and the closed liquid injection opening is welded to form a closed cavity of the vapor chamber 4. The liquid working medium may be water, alcohol, acetone, or the like.

Figure 13:
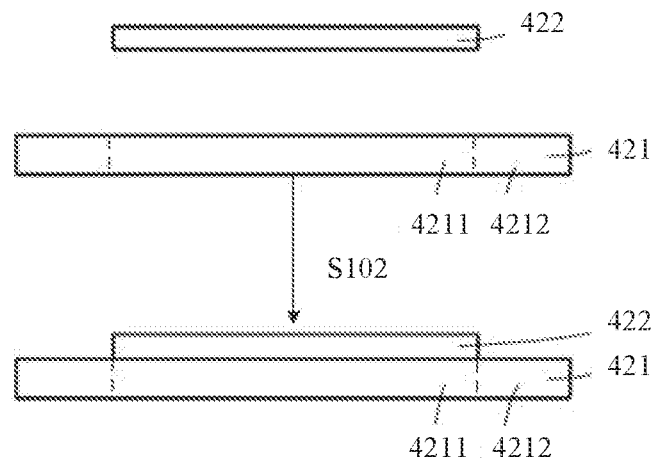
FIG. 13 is a schematic flowchart of a manufacturing method of a second cover of a vapor chamber according to an implementation of this application.

Refer to FIG. 13. The second cover 42 may alternatively be manufactured in another manner. For example, when a size of the copper layer 422 is less than a size of the first metal layer 421, the copper layer 422 may be fastened to the main body region 4211 of the first metal layer 421 by electroplating, rolling, thermal diffusion, or the like to form the second cover 42 (that is, an edge region of the copper layer 422 is not removed through etching, and the small-sized copper layer 422 directly covers and is fastened to the main body region 4211 of the first metal layer 421 by electroplating, rolling, thermal diffusion, or the like to form a composite plate layer of the copper layer 422 and the first metal layer 421). This helps improve material utilization, reduce costs, and optimize a manufacturing process of the second cover 42.

In a process of manufacturing the first cover 41 and the second cover 42, a first hole may be disposed on the first cover body 412 of the first cover, a second hole may be disposed on the second cover body 423 of the second cover 42, and the first cover body 412 and the second cover body 423 at the first hole and the second hole are sealed by disposing a sealing structure. Specifically, in a process of combining the first cover 41 with the second cover 42, a sealing structure is formed between the first hole and the second hole. The sealing structure is connected to the first cover body and the second cover body, to jointly surround the closed cavity together. In the sealing structure, the first hole is connected to the second hole to form a through hole that penetrates through the vapor chamber 4, and the through hole is used for allowing a flexible circuit board in an electronic device to pass through. For specific structures of the through hole and the sealing structure, refer to the description in the first aspect (the vapor chamber structure), Details are not described again.

In summary, in a specific manufacturing process, an architecture of the sealing structure may include but is not limited to the following solutions.

In a first solution, a portion of the sealing structure and the first cover body are an integrated structure, and a portion of the sealing structure and the second cover body are an integrated structure. In a process of combining the first cover with the second cover, the two portions of sealing structures are connected, and sealed and fastened.

In a second solution, the sealing structure and the first cover body are an integrated structure. In a process of combining the first cover with the second cover, an end part that is of the sealing structure and that is away from the first cover body is combined and sealed with, and fastened to an edge of the second hole of the second cover body.

In a third solution, the sealing structure and the second cover body are an integrated structure. In a process of combining the first cover with the second cover, an end part that is of the sealing structure and that is away from the second cover body is combined and sealed with, and fastened to an edge of the first hole of the first cover body.

In a fourth solution, the sealing structure is a single structure independent of the first cover body and the second cover body, and two ends of the sealing structure are in a sealed connection to an edge of the first hole of the first cover body and an edge of the second hole of the second cover body. The sealing structure in this solution may be a sleeve-like structure, a flexible sheet-like structure, or a paste-like structure.

The edge region 4212 of the first metal layer 421 is in a sealed connection to an edge of the third metal layer 411 by welding. The welding and sealing can enhance strength of bonding between the first metal layer 421 and the third metal layer 411, to prevent leakage of a liquid working medium in the cavity. During welding, there is a problem of welding strength. To enable the vapor chamber 4 to have good welding strength, a material of the third metal layer 411 and a material of the first metal layer 421 are metal materials of a same type. The metal materials of the same type mean that the material of the third metal layer 411 is the same as an element with highest content in the material of the first metal layer 421. For example, both the material of the third metal layer 411 and the material of the first metal layer 421 may be a titanium alloy. Alternatively, both the material of the third metal layer 411 and the material of the first metal layer 421 may be stainless steel. The material of the third metal layer 411 and the material of the first metal layer 421 may be another high-strength metal material. When the metal materials of the same type are welded, no brittle phase is generated, so that the metal materials of the same type have high welding strength.

In a possible implementation, the material of the third metal layer 411 and the material of the first metal layer 421 may alternatively be metal materials of different types that have weldability. Weldability means that elements with highest content are different, a burning loss temperature of a metal with a low melting point is less than a melting point of a metal with a high melting point, no brittle phase is generated in a bonding region of the two metals, and hardness of a welding part is greater than the lowest hardness of the two metals by more than 80%. For example, the material of the third metal layer 411 is a titanium alloy, and the material of the first metal layer 421 is a material that is weldable to the third metal layer 411. Alternatively, the material of the first metal layer 421 is a titanium alloy, and the material of the third metal layer 411 is a material that is weldable to the first metal layer 421. Other different types of metal materials that have weldability may also be used as materials of the third metal layer and the first metal layer.

In a process of combining the first cover 41 with the second cover 42, a connection structure is further disposed in a closed cavity, so as to avoid a problem that the first cover 41 and the second cover 42 easily interfere with another component due to deformation such as bulging and warping after the vapor chamber is heated. For a specific structure and a formation manner of the connection structure, refer to the description of the first aspect (the vapor chamber structure). Details are not described again.

The vapor chamber is manufactured by using copper and a high-strength metal composite plate, so that strength of the vapor chamber is improved. In addition, the wick structure is formed by sintering on the copper layer, so that problems of difficulty in forming the wick structure on another metal plate and a low yield can be avoided. This enhances structural strength and heat dissipation performance.

According to a third aspect, the following describes in detail a middle frame assembly and a manufacturing method thereof by using seven specific embodiments. Details are as follows.

Embodiment 1

Figure 14:
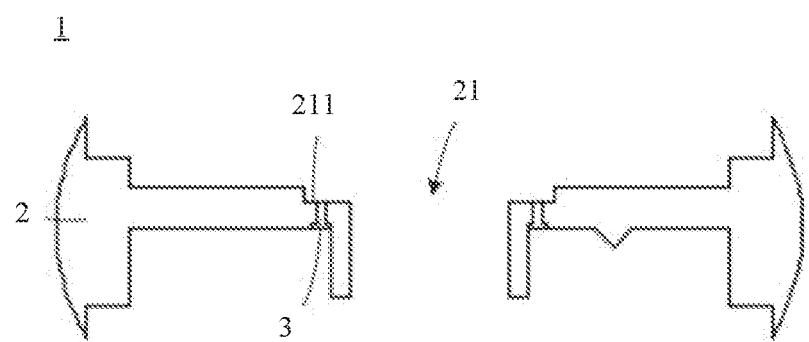
FIG. 14 is a schematic diagram of a structure showing a combination of a middle frame and a connector according to Embodiment 1 of this application.
Figure 15:
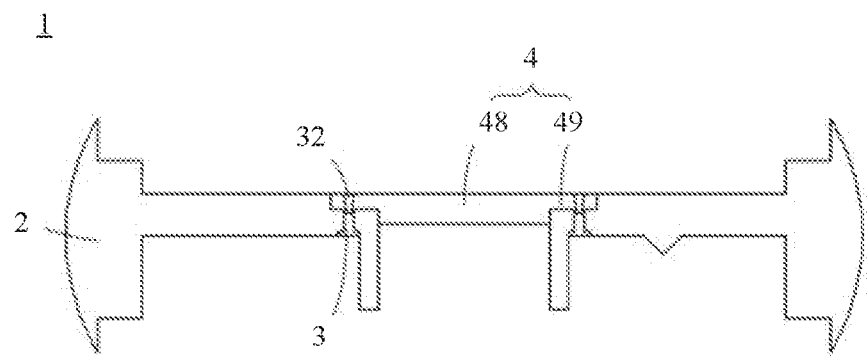
FIG. 15 is a schematic diagram of a structure of a middle frame assembly according to Embodiment 1 of this application.
Figure 16:
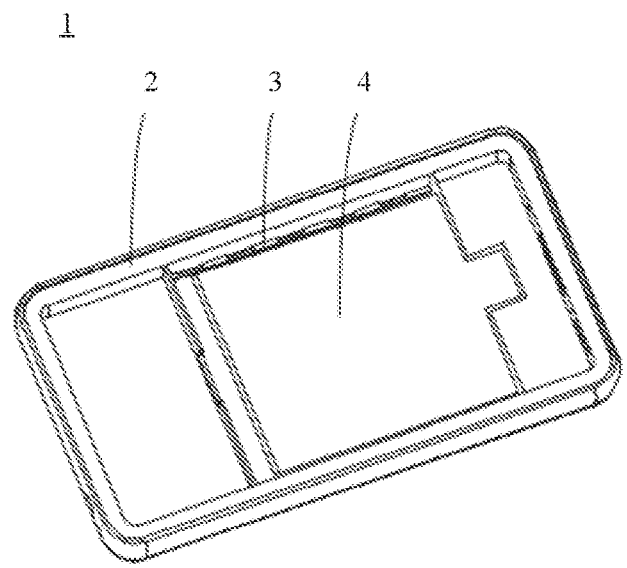
FIG. 16 is a schematic diagram of a three-dimensional structure of a middle frame assembly according to Embodiment 1 of this application.

A specific structure of the middle frame assembly provided in this embodiment is as follows, FIG. 14 is a structural sectional view of a middle frame having a connector. FIG. 15 is a structural sectional view after a vapor chamber is mounted on a middle frame. FIG. 16 is a three-dimensional schematic diagram of a middle frame assembly formed by mounting a vapor chamber on a middle frame. This application provides a middle frame assembly 1, including a middle frame 2, connectors 3, and a vapor chamber 4.

Refer to FIG. 14. The middle frame 2 is provided with a through hole 21. The connectors 3 are integrated with the middle frame 2. Some of the connectors 3 are exposed on a surface of the middle frame 2 to form a welding part, and the welding part is located on an inner wall of the through hole or a surface of the middle frame used to carry a component in an electronic device, and is used to weld the vapor chamber 4. It may be understood that the welding part is located on the surface of the middle frame 2. The surface of the middle frame 2 herein refers to a portion of the inner wall that forms the through hole 21 or the surface of the middle frame 2 used to carry the component in the electronic device. The component in the electronic device may be an electronic component. Specifically, the component may be an electronic component that emits heat in the electronic device in a working state, or may be referred to as a heat emitting part, for example, a battery or a mainboard (a component such as a heat emitting chip is disposed on the mainboard).

In a possible implementation of this application, the vapor chamber 4 is provided with a through hole 40 for allowing a flexible circuit board to pass through, and the middle frame 2 is provided with a through hole 21 for mounting the vapor chamber 4. For distinguishing understanding, the through hole 21 on the middle frame 2 may be referred to as a first through hole, and the through hole 40 on the vapor chamber 4 may be referred to as a second through hole.

In another implementation, alternatively, no through hole may be disposed on the middle frame 2 in the electronic device provided in this application, and the vapor chamber 4 is directly installed on the middle frame 2. For example, a portion of a thickness is reserved as a carrying region at a position where the vapor chamber needs to be mounted on the middle frame 2, The thickness of the carrying region may be very small, and may be specifically less than a thickness of the vapor chamber 4. The carrying region may be used to carry the vapor chamber to ensure support strength at the position of the vapor chamber. In addition, the carrying region is used as a positioning surface of the vapor chamber, so that a process of mounting the vapor chamber is simple.

Refer to FIG. 15 and FIG. 16, The vapor chamber 4 includes a vapor chamber body 48 and a surrounding edge 49 surrounding the vapor chamber body 48 (specifically, the surrounding edge 49 at a first metal layer and a third metal layer is formed by combining an edge region of the first metal layer of the vapor chamber 4 with an edge of the third metal layer). The vapor chamber 4 is accommodated in the through hole 21, and the surrounding edge 49 is welded with the connectors 3, so that the vapor chamber 4 and the middle frame 2 are combined to jointly serve as a carrying part in an electronic device.

The connectors 3 and the surrounding edge 49 are metal materials of a same type. The metal materials of the same type mean that a material of the connectors 3 is the same as an element with highest content in a material of the surrounding edge 49. When the metal materials of the same type are welded, no brittle phase is generated, so that the metal materials of the same type have high welding strength. Alternatively, the connectors 3 and the surrounding edge 49 are metal materials of different types that have weldability. Weldability means that elements with highest content are different, a burning loss temperature of a metal with a low melting point is less than a melting, point of a metal with a high melting point, no brittle phase is generated in a bonding region of the two metals, and hardness of a welding part is greater than the lowest hardness of the two metals by more than 80% (For a structure of the vapor chamber 4 in the middle frame assembly 1, refer to a specific structure of the vapor chamber 4 provided in the first aspect, and details are not described herein.)

In this embodiment, a material of the middle frame 2 is a 6013-T6 (peak aging state) aluminum alloy, a material of the connectors 3 is a TA4-M (annealing state) titanium alloy, and a material of the surrounding edge 49 of the vapor chamber 4 is a TA4-M titanium alloy. Materials of the middle frame 2, the connectors 3, and the vapor chamber 4 may be selected according to a product requirement. For example, a combination of materials of the middle frame 2, the connectors 3, and the vapor chamber 4 is shown in the following table.

inner wall of the through hole 21 includes a step surface 211. The connector 3 is embedded into the middle frame 2, and the connector 3 is partially exposed on the step surface 211 (the step surface 211 is a portion of the inner wall forming the through hole 21), so that the connector 3 is in contact with the vapor chamber 4. As shown in FIG. 15, the surrounding edge 49 of the vapor chamber 4 is lapped on the step surface 211 and is welded to a local position of the connector 3 on the step surface 211. In other words, the surrounding edge 49 of the vapor chamber 4 is welded to the local position corresponding to the connector 3 to fasten the connector 3 and the vapor chamber 4 (that is, the middle frame 2 and the vapor chamber 4 are welded by using the connector 3). The connector 3 may be combined with the middle frame 2 in an embedding manner. The embedding direction may be a direction perpendicular to a plane on which the middle frame 2 is located, or may have a specific angle with a direction of a plane on which the middle frame 2 is located. When there are a plurality of connectors 3, the embedding directions of the plurality of connectors 3 may be the same or different, and may be set according to a requirement.

Figure 17:
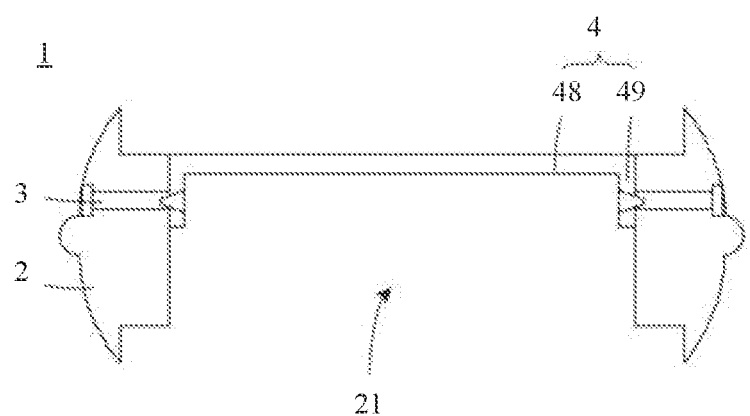
FIG. 17 is a schematic diagram of a structure of another middle frame assembly according to Embodiment 1 of this application.

In another possible implementation, refer to FIG. 17, the through hole 21 may alternatively be a straight through hole, and an inner wall of the through hole 21 faces the inside of the through hole. The surrounding edge 49 of the vapor chamber 4 is bent relative to the vapor chamber body 48, the connector 3 is embedded into the middle frame 2, and the connector 3 extends from an outer edge of the middle frame 2 to an inner wall of the middle frame 2 facing the through hole 21. An appearance feature of the vapor chamber 4 is not limited to a planar shape, and may alternatively be a curved surface shape or a special shape, which is specifically set according to an appearance feature of the middle frame.

Figure 18:
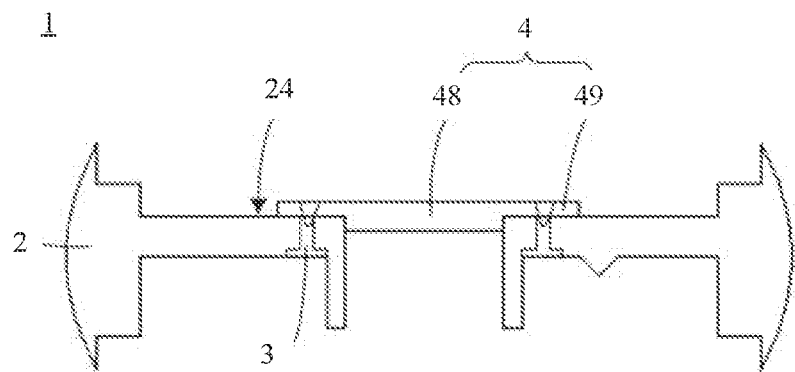
FIG. 18 is a schematic diagram of a structure of another middle frame assembly according to Embodiment 1 of this application.

In the implementations shown in FIG. 15 and FIG. 17, the surrounding edge 49 of the vapor chamber 4 may be located in the through hole 21. In another implementation, refer to FIG. 18, the surrounding edge 49 may alternatively be located on a surface of the middle frame 2 used to carry a component in an electronic device. Specifically, the middle frame 2 is provided with a lap surface 24. The lap surface 24

| | Material combination | | | | | | |
|---|---|---|---|---|---|---|---|
| | Combination 1 | Combination 2 | Combination 3 | Combination 4 | Combination 5 | Combination 6 | Combination 7 |
| Middle frame | Aluminum alloy | Magnesium alloy | Aluminum alloy | Aluminum alloy | Aluminum alloy | Aluminum alloy | Stainless steel |
| Vapor chamber | Titanium alloy | Titanium alloy | Stainless steel | Stainless steel | Copper alloy | Copper alloy | Titanium alloy |
| Connector | Titanium alloy | Titanium alloy | Stainless steel | Copper alloy | Copper alloy | Stainless steel | Titanium alloy |
| | Combination 8 | Combination 9 | Combination 10 | Combination 11 | Combination 12 | Combination 13 | Combination 14 |
| Middle frame | Stainless steel | Magnesium alloy | Magnesium alloy | Magnesium alloy | Magnesium alloy | Titanium alloy | Titanium alloy |
| Vapor chamber | Copper alloy | Stainless steel | Stainless steel | Copper alloy | Copper alloy | Copper alloy | Stainless steel |
| Connector | Copper alloy | Copper alloy | Stainless steel | Copper alloy | Stainless steel | Copper alloy | Stainless steel |

The through hole 21 of the middle frame 2 may have different structures. For example, as shown in FIG. 14, the through hole 21 may be a step-shaped through hole, that is, a hole wall forming the through hole is step-shaped. An is a surface of the middle frame 2 used to carry the component in the electronic device. The surrounding edge 49 is lapped on the lap surface 24 and is welded to some of the connectors 3 on the lap surface 24.

Figure 19:
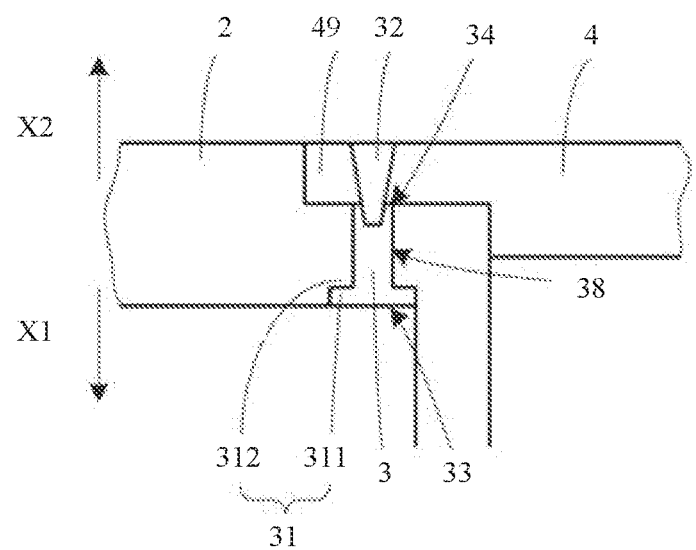
FIG. 19 is a schematic diagram of a first limiting structure and a second limiting structure according to Embodiment 1 of this application.

Refer to FIG. 19. A first limiting structure 31 is disposed at a joint of the connector 3 and the middle frame 2, to implement limiting in a first direction X1. The connector 3 and the surrounding edge 49 are welded to form a second limiting structure 32, to implement limiting in a second direction X2. The first direction X1 and the second direction X2 are opposite directions. In this application, strength of bonding among the middle frame, the connector, and the vapor chamber in the middle frame assembly 1 is improved by combining the middle frame 2 with the connector 3. To promote a thinned design of the electronic device, a size of the middle frame 2 is limited. To ensure structural stability of the connector 3, in this application, the first limiting structure 31 is formed at the joint of the connector 3 and the middle frame, and the second limiting structure 32 is formed between the connector 3 and the surrounding edge 49 of the vapor chamber 4. The first limiting structure 31 and the second limiting structure 32 implement bidirectional fastening of the connector 3 in the first direction X1 and the second direction X2, so as to ensure structural stability of the connector 3 and prevent the connector 3 from falling of.

Refer to FIG. 19, in this implementation, the connector 3 may be embedded into the middle frame 2. The connector 3 includes a first end surface 33 and a second end surface 34 that are opposite to each other and a side surface 38 connected between the first end surface 33 and the second end surface 34. The side surface 38 is located in the middle frame 2, and the first end surface 33 and the second end surface 34 are exposed on a surface of the middle frame. In another implementation, the first end surface 33 may not be exposed on the surface of the middle frame. For example, the first end surface 33 may be covered by performing plastic injection molding and sealing on the middle frame, so that the first end surface 33 is not exposed.

The first limiting structure 31 and the second limiting structure 32 that are formed after the connector 3 is embedded into the middle frame 2 have different implementations. An example is as follows.

As shown in FIG. 19, the first limiting structure 31 and the second limiting structure 32 are respectively located on the first end surface 33 and the second end surface 34 of the connector 3. Specifically, the first limiting structure 31 is located on the first end surface 33 of the connector 3, and the second limiting structure 32 is located on the second end surface 34 of the connector 3. The first limiting structure 31 includes a position-limiting pin 311 formed on the first end surface 33 of the connector 3 and a position-limiting step 312 formed on the middle frame 2. The position-limiting pin 311 is located on a side that is of the position-limiting step 312 and that is away from the second limiting structure 32, and is fixedly lapped on the position-limiting step 312. The second limiting structure 32 prevents the connector 3 from falling off in a second direction X2, to implement limiting in the second direction X2. The position-limiting step 312 prevents the connector 3 from falling off in a first direction X1, to implement limiting in the first direction X1.

Figure 20:
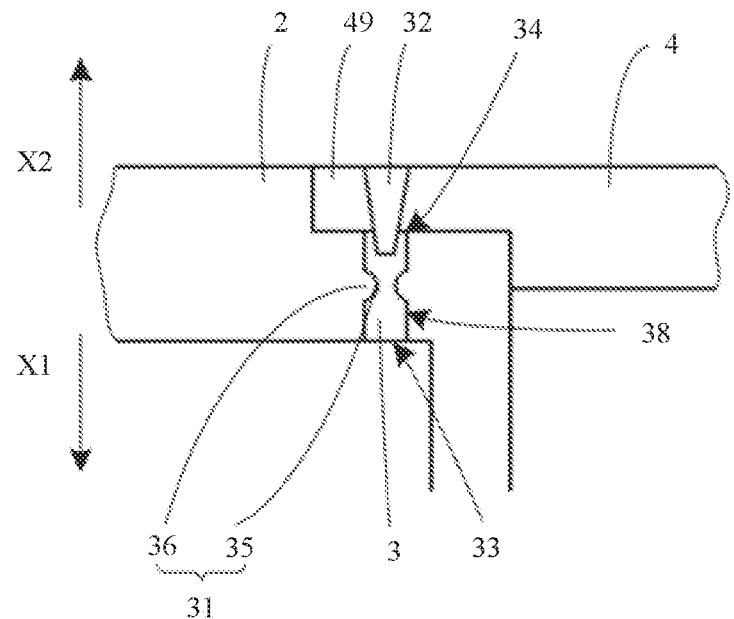
FIG. 20 is a schematic diagram of another first limiting structure and second limiting structure according to Embodiment 1 of this application.

As shown in FIG. 20, the first limiting structure 31 is formed on the side surface 38, and the second limiting structure 32 is located on the second end surface 34 of the connector 3. Specifically, the first limiting structure 31 includes a concave part 35 formed on the side surface 38 of the connector 3 and a protrusion part 36 formed on the middle frame 2. The protrusion part 36 cooperates with the concave part 35, so that the connector 3 is clamped into the middle frame 2 to prevent the connector 3 from falling off along a first direction X1, thereby implementing limiting in the first direction X1. The second limiting structure 32 prevents the connector 3 from falling off in a second direction X2, to implement limiting in the second direction X2.

Figure 21:
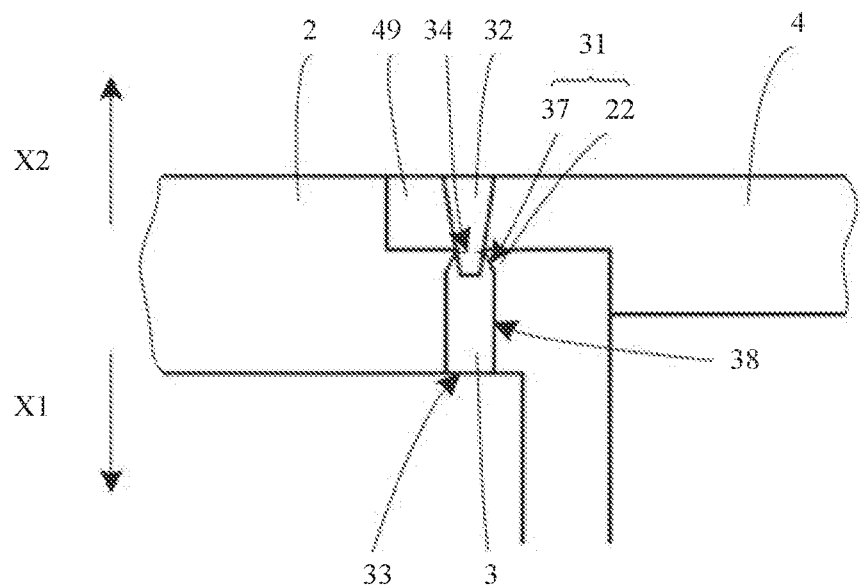
FIG. 21 is a schematic diagram of another first limiting structure and second limiting structure according to Embodiment 1 of this application.

As shown in FIG. 21, both the first limiting structure 31 and the second limiting structure 32 are located on the second end surface 34 of the connector 3. Specifically, the side surface 38 and the second end surface 34 are connected by using a limiting surface 37. The limiting surface 37 is an inclined surface extending relative to the second end surface 34. The second end surface 34 is used to weld with the surrounding edge 49. The first limiting structure 31 includes the limiting surface 37 and a limiting part 22 that is of the middle frame 2 and that cooperates with the limiting surface 37, and the limiting part 22 is fixedly connected between the surrounding edge 49 and the limiting surface 37.

Figure 22:
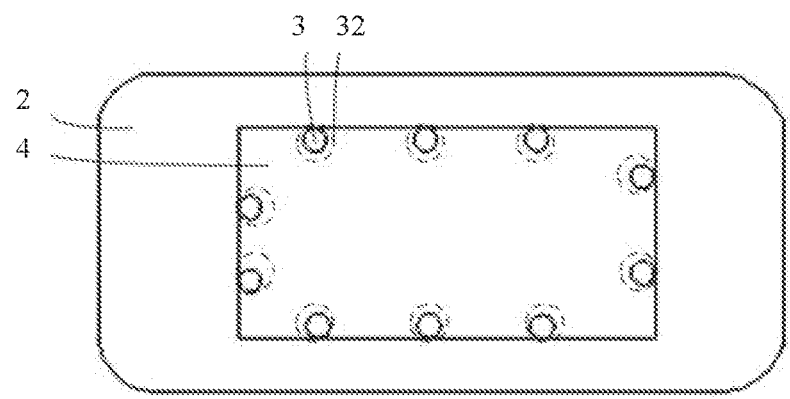
FIG. 22 is a schematic diagram of a distribution structure of a connector and a second limiting structure according to Embodiment 1 of this application.
Figure 23:
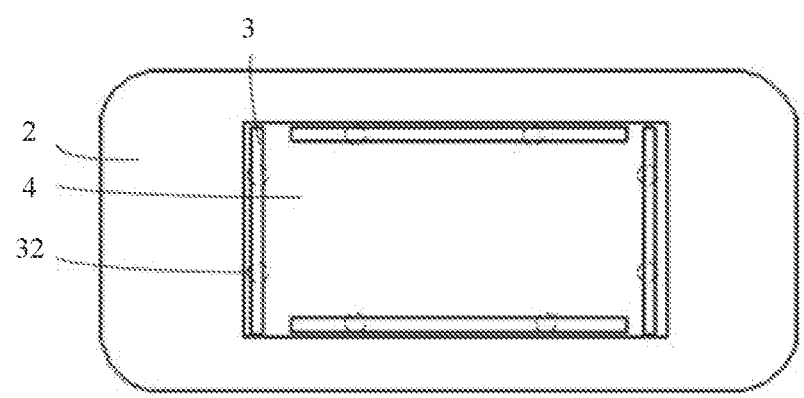
FIG. 23 is a schematic diagram of a distribution structure of another connector and a second limiting structure according to Embodiment 1 of this application.

The second limiting structure 32 is correspondingly disposed on the connector 3. There are a plurality of second limiting structures 32 between the connectors 3 and the vapor chamber 4, and the connectors 3 are in a one-to-one correspondence with the second limiting structures 32 (refer to FIG. 22, a size of a circle in FIG. 22 does not represent an actual size of the connector 3 and the second limiting structure, but is only used to reflect a correspondence between the connector 3 and the second limiting structure 32), or the connectors 3 are in a long strip shape, and each connector 3 corresponds to at least two of the second limiting structures 32 (refer to FIG. 23).

Figure 24:
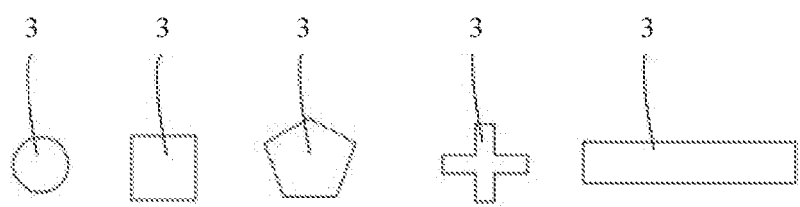
FIG. 24 is a schematic diagram of a form of a connector according to Embodiment 1 of this application.

In a possible implementation, a shape of the connector 3 is not limited. The connectors 3 may be distributed on the middle frame 2 in a dot-like layout, or may be distributed on the middle frame 2 in a strip-like layout (refer to FIG. 22 and FIG. 23). In other words, a shape of a section of the connector 3 is not limited. The section of the connector 3 may be a circle, a long strip, a square, an irregular shape, or the like (refer to FIG. 24), and may be specifically designed according to a requirement.

Figure 25:
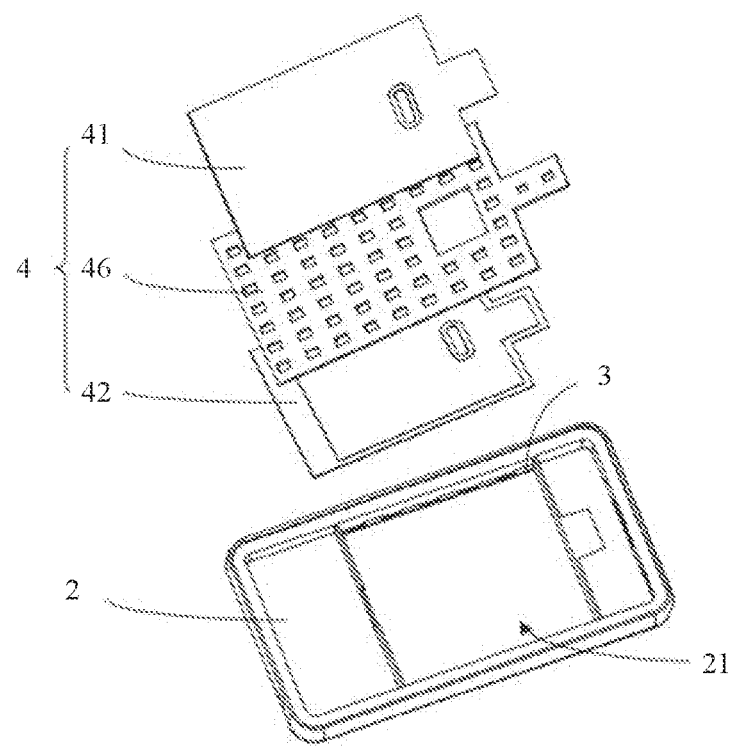
FIG. 25 is a schematic diagram of a corresponding structure between a surrounding edge of a vapor chamber and a connector according to Embodiment 1 of this application.

FIG. 25 is a schematic three-dimensional exploded diagram of the vapor chamber 4 and the middle frame 2. As shown in FIG. 25, the vapor chamber 4 may be in a square or polygonal architecture, a shape of the through hole 21 matches a shape of the vapor chamber 4, and at least one connector 3 is correspondingly disposed on a surrounding edge on each edge of the vapor chamber 4.

Figure 26:
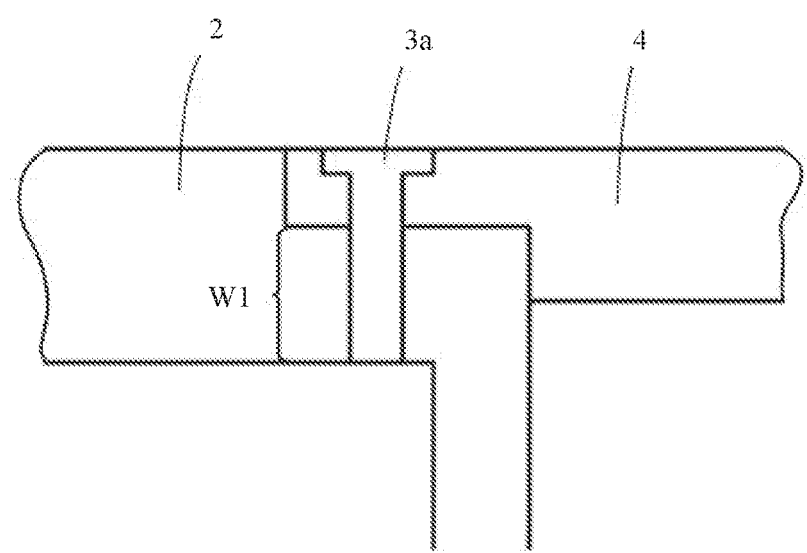
FIG. 26 is a schematic diagram of a structure in which only a connector is fastened according to Embodiment 1 of this application.

In this application, the middle frame 2 and the vapor chamber 4 are fixedly connected by using the connectors 3 and disposing a welding architecture 32, so that strength of bonding between the middle frame 2 and the vapor chamber 4 can be enhanced, and an ultra-thin connection between the middle frame 2 and the vapor chamber 4 can be implemented. Specifically, if the vapor chamber 4 is directly welded to an aluminum alloy middle frame 2, an aluminum alloy is of a precipitation reinforcement type. After welding is performed, strength of both a molten pool region and a heat-affected region decreases greatly. In addition, the middle frame 2 and the vapor chamber 4 are made of two different materials. When the two different materials are welded, a brittle phase is easily generated, which is also unfavorable to improvement of strength of bonding. Therefore, compared with direct welding, in this application, transition is performed by using the connector 3 to implement welding between metals of a same type, and there is no strength loss. If the vapor chamber 4 is directly fastened on the middle frame 2 by using the connector 3 (refer to FIG. 26), and is fastened by embedding between the connector 3 and the middle frame 2, bonding force can be ensured only when a thickness W1 of a joint between the connector 3 and the middle frame 2 is greater than 0.5 mm. If the thickness is excessively small, the connector 3 easily falls off from the middle frame 2 to cause a connection failure. In this case, compared with direct embedding between the connector and the middle frame, in this application, fastening is not implemented only by embedding between the connector 3 and the middle frame 2, and a thickness of a bonding region of the middle frame 2 is not limited.

Figure 27:
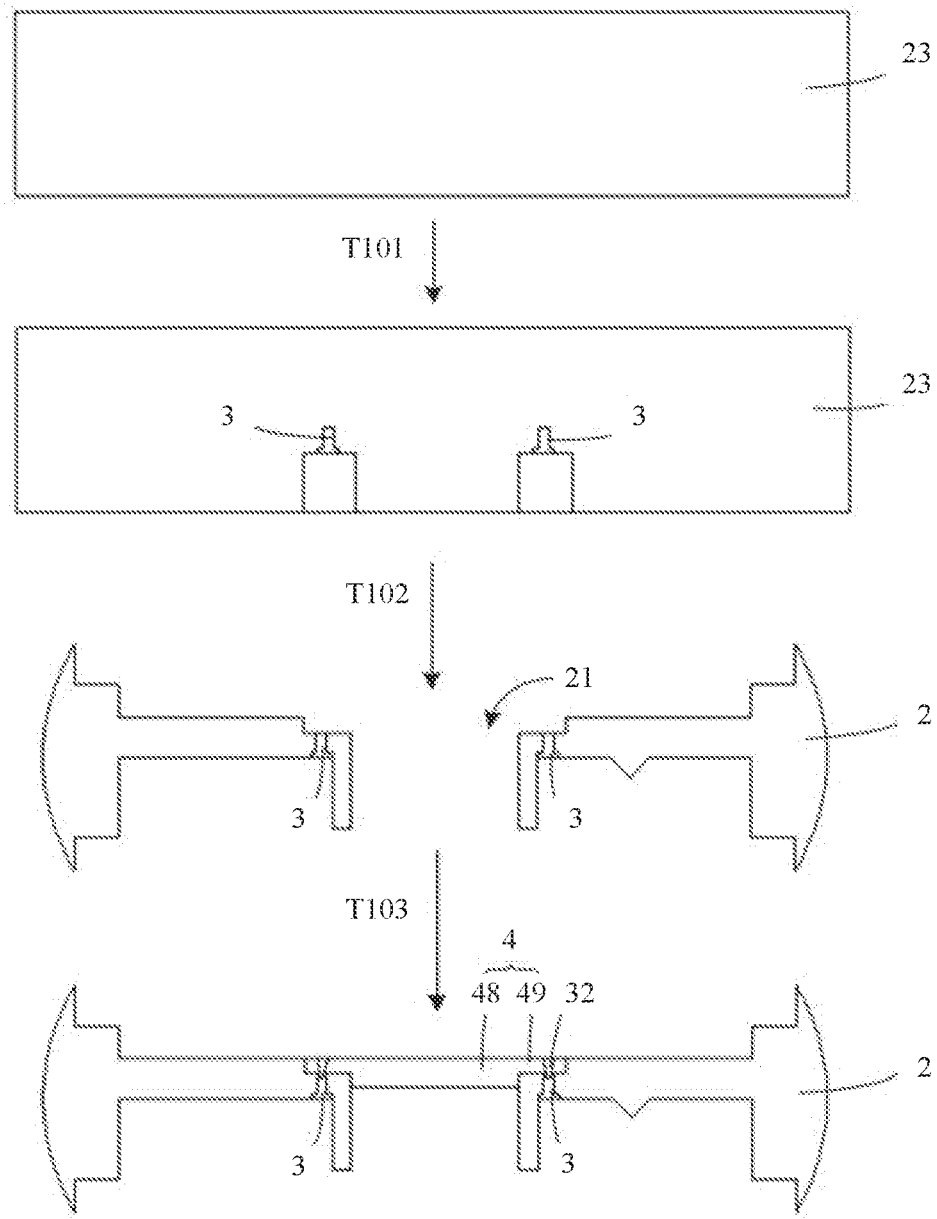
FIG. 27 is a flowchart of manufacturing a middle frame assembly according to Embodiment 1 of this application.

This embodiment provides a manufacturing method of the middle frame assembly 1, as shown in FIG. 27, a specific manufacturing method of the middle frame assembly 1 is as follows.

T101: Manufacture the middle frame 2, including combining a middle frame billet 23 with the connectors 3.

The middle frame billet 23 for making the middle frame 2 is provided, and the connector 3 is embedded into the middle frame billet 23. A process of embedding the connector 3 into the middle frame billet 23 may be selected according to a requirement. For example, the connector 3 may be riveted into the middle frame billet 23 after a hole is provided on a designed position of the middle frame billet 23, or the connector 3 may be embedded into the middle frame billet 23 in a threaded screwing manner, or another process may be selected for embedding, for example, a process of processing an inner cavity before nano injection molding or after nano injection molding.

T102: Machine the middle frame billet 23 to form the middle frame 2, and perform anodic oxidization treatment.

The middle frame billet 23 for embedding the connectors 3 is machined to form the middle frame 2 with the through hole 21, and some of the connectors 3 are exposed on the surface of the middle frame 2. Specifically, steps of machining the middle frame billet 23 include computer digital control, combination of metal and plastic by nanotechnology, computer digital control, mechanical polishing and polishing of an appearance surface, and the like.

After the middle frame 2 with the through hole 21 is formed, anodic oxidization treatment is performed on the middle frame 2. The anodic oxidization treatment may form a hard oxide film on a surface of the middle frame, to enhance strength of the middle frame and protect the middle frame. To prevent the connector 3 from being oxidized, the connector 3 may be made of a material such as a titanium alloy. The titanium alloy has excellent corrosion resistance. In a process of performing anodic oxidization treatment on the middle frame 2, the connector 3 made of the titanium alloy material is not corroded. The middle frame 2 of a required structure and appearance is obtained through machining and anodic oxidization treatment.

FIG. 27 shows a sectional view, and a quantity of connectors 3 combined in the middle frame shown in the figure is two. Specifically, in a manufacturing process, the quantity and specific positions of the connectors need to be set according to a size and a shape of the vapor chamber. In FIG. 27, there is one connector 3 on each of two sides of the through hole 21. Structures of the two connectors 3 may be the same, and connection relationships between the connectors and the vapor chamber are also the same. Therefore, only a connection structure between the connector on the right side and the vapor chamber is numbered in FIG. 27.

T103: Provide a vapor chamber 4, and mount the vapor chamber 4 on the middle frame 2.

For a specific manufacturing method of the vapor chamber 4, refer to the manufacturing method of the vapor chamber 4 in the second aspect. Details are not described herein again. The vapor chamber 4 includes the vapor chamber body 48 and the surrounding edge 49 surrounding the vapor chamber body 48. The surrounding edge 49 and the connectors 3 are metal materials of a same type. The metal materials of the same type mean that a material of the surrounding edge 49 is the same as an element with highest content in a material of the connectors 3. When the metal materials of the same type are welded, no brittle phase is generated, so that the metal materials of the same type have high welding strength. Alternatively, the surrounding edge 49 and the connectors 3 are metal materials of different types that have weldability. Weldability means that elements with highest content are different, a burning loss temperature of a metal with a low melting point is less than a melting point of a metal with a high melting point, no brittle phase is generated in a bonding region of the two metals, and hardness of a welding part is greater than the lowest hardness of the two metals by more than 80%.

The vapor chamber 4 is placed in the through hole 21, and the surrounding edge 49 and the connectors 3 are welded. Specifically, the second limiting structure 32 is formed in a welding process. One second limiting structure 32 may be formed on each connector 3, or at least two second limiting structures 32 may be correspondingly formed on each connector 3. A welding manner may be fusion welding, pressure welding, or brazing (the TA4 titanium alloy is a solid solution reinforced material, and high material strength can still be obtained even if fusion welding is used).

Embodiment 2

This embodiment provides a middle frame assembly 1. A specific structure of the middle frame assembly 1 in Embodiment 2 is the same as the structure of the middle frame assembly 1 in Embodiment 1, and details are not described herein again. A difference between Embodiment 2 and Embodiment 1 lies in difference of a manufacturing method of the middle frame assembly 1 (for materials of the middle frame, the connector, and the vapor chamber in Embodiment 2, refer to Embodiment 1). Details are as follows.

Figure 28:
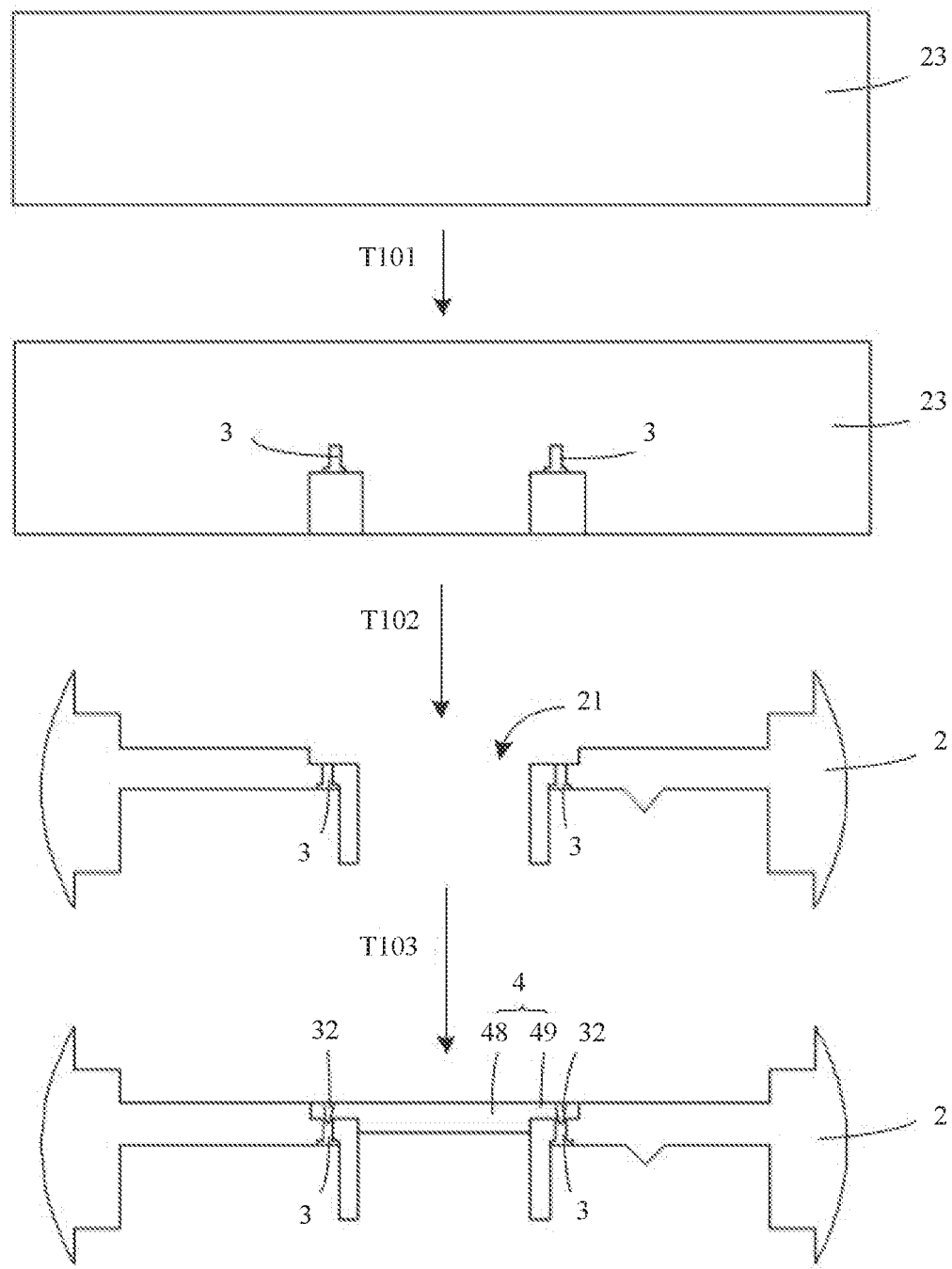
FIG. 28 is a flowchart of manufacturing a middle frame assembly according to Embodiment 2 of this application.

This embodiment provides a manufacturing method of the middle frame assembly 1. As shown in FIG. 28, a specific manufacturing method of the middle flame assembly 1 is as follows.

T101: Manufacture a middle frame 2.

A middle frame billet 23 for manufacturing the middle frame 2 is provided. The middle frame billet 23 is machined to form the middle frame 2 with a through hole 21. Steps of machining the middle frame billet 23 include computer digital control, combination of metal and plastic by nanotechnology, computer digital control, mechanical polishing and polishing of an appearance surface, and the like. Anodic oxidization treatment is performed on the middle frame 2 with the through hole 21. The anodic oxidization treatment may form a hard oxide film on a surface of the middle frame, to enhance strength of the middle frame and protect the middle frame. The middle frame 2 of a required structure and appearance is obtained through machining and anodic oxidization treatment.

T102: Combine connectors 3 with the middle frame 2.

The connectors 3 that are made of a material different from that of the middle frame 2 are combined with the middle frame 2, the middle frame 2 is provided with the through hole 21, and the connectors 3 and the middle frame 2 may be integrated in an embedding manner. Specifically, the connectors 3 are embedded into the middle frame 2 on which the anodic oxidization treatment is performed, and some of the connectors 3 are exposed on a surface of the middle frame 2. After the anodic oxidization treatment, the connectors 3 are embedded into the middle frame 2, so that the material of the connectors 3 is not limited. That is, after the anodic oxidization treatment, the connectors 3 are embedded into the middle frame 2, the connectors 3 are not subjected to anodic oxidization treatment, and corrosion of the anodic oxidization treatment of the connectors 3 does not need to be considered. The material of the connectors 3 may be stainless steel or the like.

A process of embedding the connector 3 into the middle frame 2 may be selected according to a requirement. For example, the connector 3 may be riveted into the middle frame 2 after a hole is provided on a designed position of the middle frame 2, or the connector 3 may be embedded into the middle frame 2 in a threaded screwing manner, or another process may be selected for embedding, for example, a process of processing an inner cavity before nano injection molding or after nano injection molding.

T103: Provide a vapor chamber 4, and mount the vapor chamber 4 on the middle frame 2.

For a method for mounting the vapor chamber 4, refer to Embodiment 1, and details are not described herein again.

Embodiment 3

This embodiment provides a middle frame assembly 1. A difference between a structure of the middle frame assembly in Embodiment 3 and a structure of the middle frame assembly in Embodiment 1 lies in a manner of combining connectors 3 with a vapor chamber 4. Specifically, the connectors 3 in Embodiment 3 are combined on a surface of a middle frame 2 by thermal diffusion, instead of being embedded into the middle frame 2. A specific structure of the middle frame assembly 1 in Embodiment 3 is as follows (for a structure of the middle frame 2 in Embodiment 3, refer to the structure of the middle frame 2 in Embodiment 1. For a structure of the vapor chamber 4, refer to the specific structure of the vapor chamber 4 provided in the first aspect. Details are not described herein again. For materials of the middle frame, the connectors, and the vapor chamber in this embodiment, refer to Embodiment 1).

Figure 29:
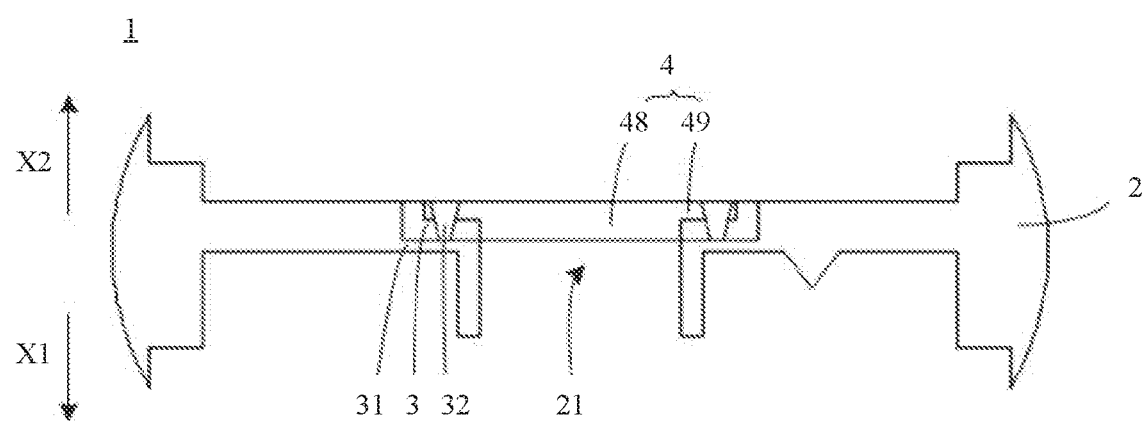
FIG. 29 is a schematic diagram of a structure of a middle frame assembly according to Embodiment 3 of this application.
Figure 30:
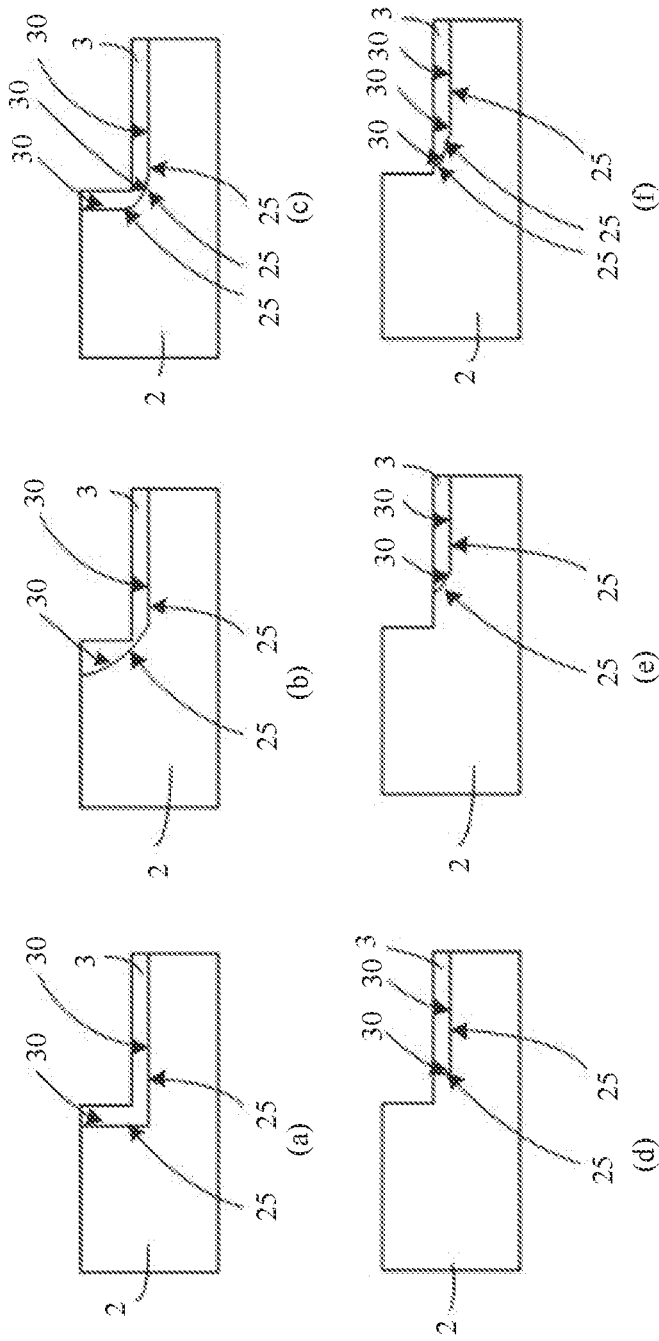
FIG. 30 is a schematic diagram of a structure showing a combination of a middle frame and a connector according to Embodiment 3 of this application.

As shown in FIG. 29 and FIG. 30, an inner side wall that is of the middle frame 2 and that faces the through hole 21 includes at least two mounting surfaces 25, and the connector 3 includes at least two connection surfaces 30, so that the at least two connection surfaces 30 of the connector 3 are respectively combined with the at least two mounting surfaces 25. Specifically, the at least two connection surfaces 30 of the connector 3 and the at least two mounting surfaces 25 of the middle frame 2 may be combined by thermal diffusion. The connector 3 is clamped between the middle frame 2 and a surrounding edge 49, so that a first limiting structure 31 and a second limiting structure 32 are combined to implement limiting in a first direction X1 and limiting in a second direction X2, Specifically, the first limiting structure 31 prevents the connector 3 from falling off in the first direction X1, to implement limiting in the first direction X1. The second limiting structure 32 prevents the connector 3 from falling off in the second direction X2, to implement limiting in the second direction.

The connector 3 may have different structures. For example, the connector 3 may be in an "L" shape, and the surrounding edge 49 of the vapor chamber 4 is lapped on the connector 3 in the "L" shape. The connector 3 may alternatively be in a long strip shape or an irregular shape (refer to FIG. 30), provided that at least two connection surfaces are combined with the middle frame 2.

Figure 31:
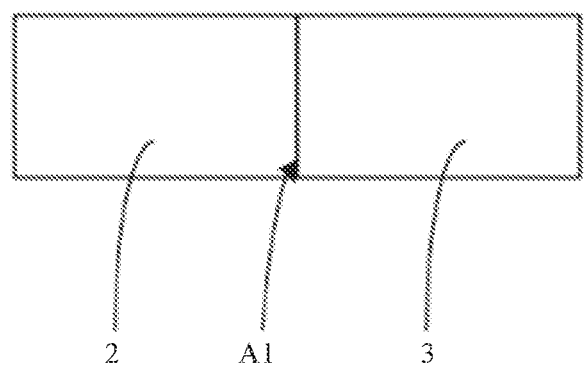
FIG. 31 is a schematic diagram of a structure showing thermal diffusion welding according to Embodiment 3 of this application.
Figure 32:
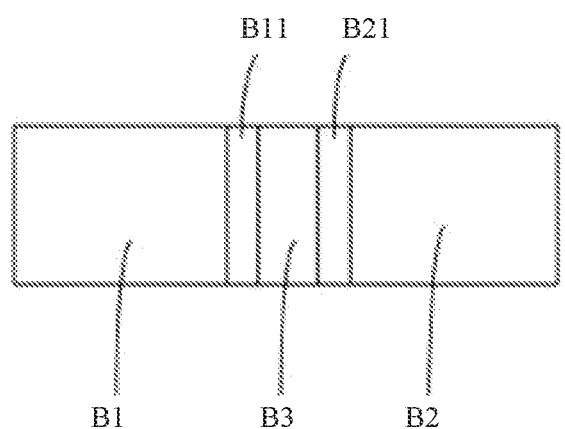
FIG. 32 is a schematic diagram of a structure of fusion welding according to Embodiment 3 of this application.

In a possible implementation, the at least two connection surfaces 30 of the connector 3 and the at least two mounting surfaces 25 of the middle frame 2 may be combined by thermal diffusion. Compared with common fusion welding, there is an obvious boundary line at the joint between the connector 3 and the middle frame 2 (the boundary line at the joint can be clearly displayed in a manner such as corrosion), and there is no heat-affected region. A size of a composite region A1 is less than or equal to 0.1 mm (refer to FIG. 31). After welding is performed, good thermal conductivity exists between the connector 3 and the middle frame 2. In fusion welding, a size of a welding fusion region B3 of a welded metal B1 and a welded metal B2 is usually greater than 0.1 mm, and a heat-affected region B11 of the metal B1 and a heat-affected region B21 of the metal B2 are formed after welding, where B11≥0.1 mm, and B21≥0.1 mm, which is unfavorable to thermal conduction between the metal B1 and the metal B2 that are combined (refer to FIG. 32).

Figure 33:
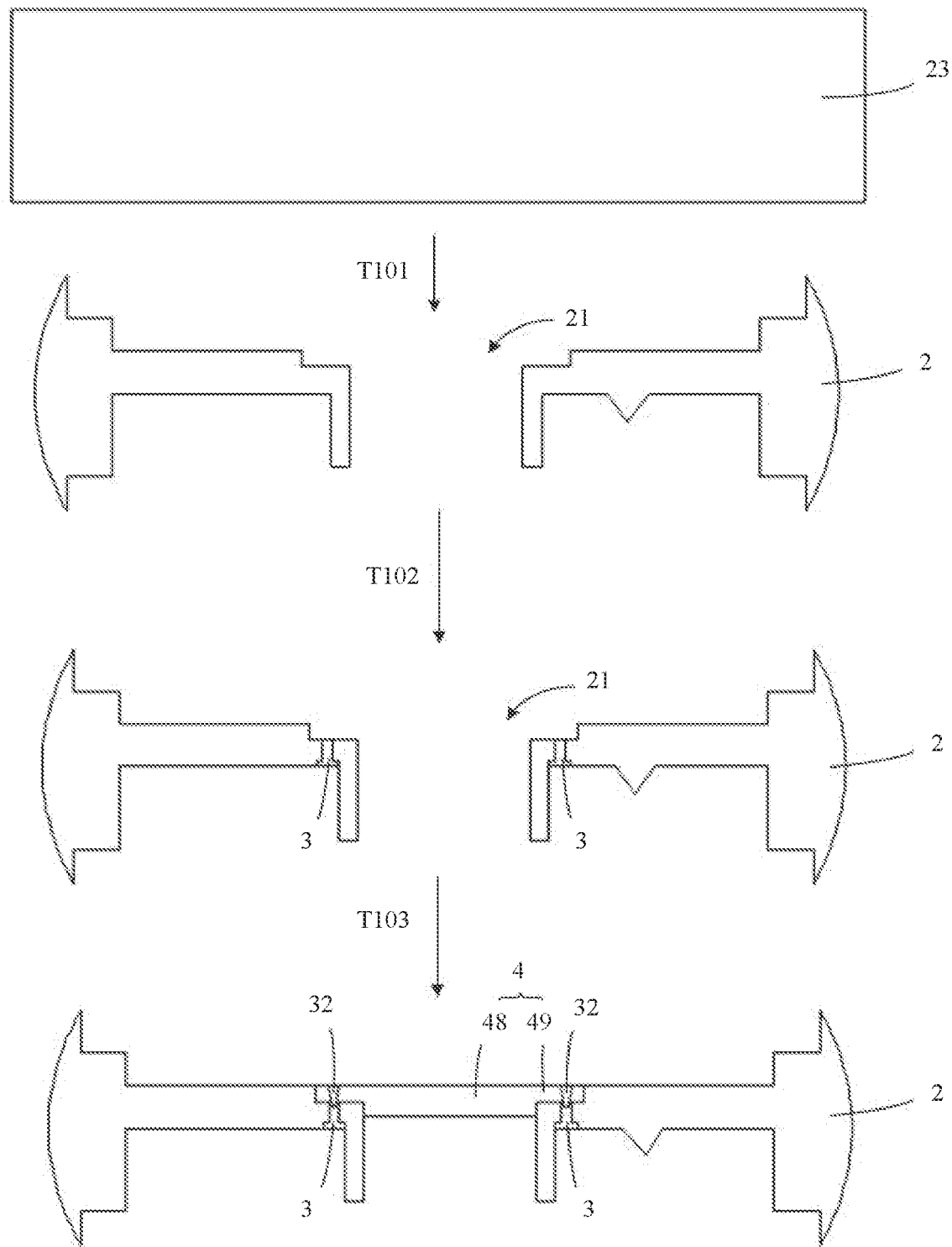
FIG. 33 is a flowchart of manufacturing a middle frame assembly according to Embodiment 3 of this application.
Figure 34:
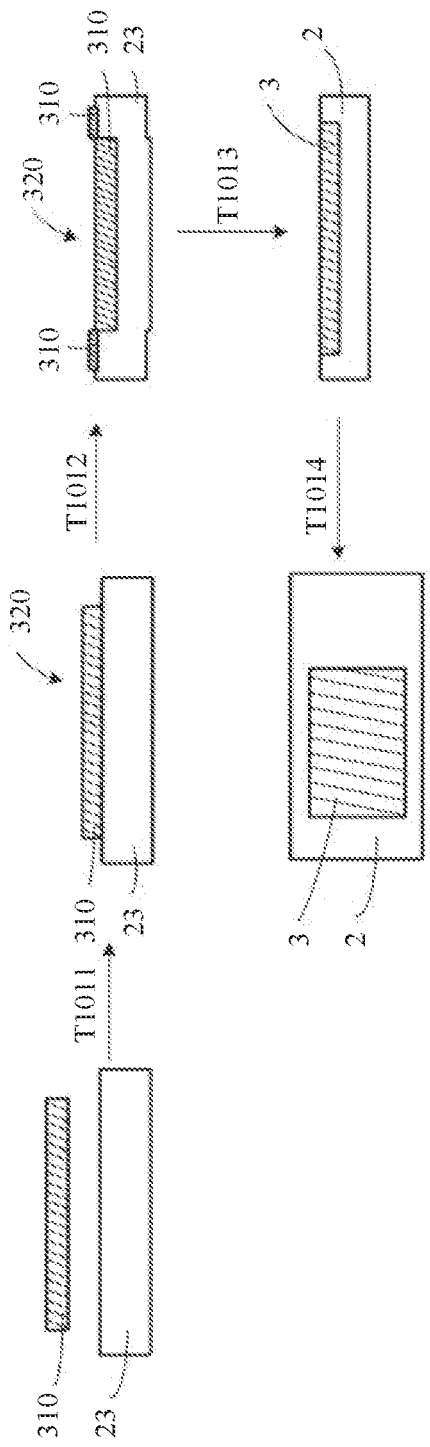
FIG. 34 is a flowchart of combining a middle frame and a connector according to Embodiment 3 of this application.

This embodiment provides a manufacturing method of a middle frame assembly 1. As shown in FIG. 33 and FIG. 34, a specific manufacturing method of the middle frame assembly 1 is as follows.

T101. Manufacture a middle frame 2, including forming a middle frame fastened with connectors 3, where the connectors 3 are integrated with the middle frame 2 by thermal diffusion, specifically including the following steps.

T1011: Manufacture a composite billet.

A 6013-T4 (natural aging state) aluminum alloy billet of a required size specification is obtained by using an aluminum alloy extrusion process, and double-sided grinding and surface finishing are performed on the 6013-T4 (natural aging state) aluminum alloy billet to obtain a spare middle frame billet 23. Surface finishing is performed on a TA4-M (annealing state) titanium alloy of a specific size specification to obtain a spare connector billet 310. The middle frame billet 23 and the connector billet 310 are compounded by thermal diffusion to obtain a composite billet 320. In this case, the middle frame billet 23 (that is, the 6013-T4 (natural aging state) aluminum alloy) changes from a T4 state to an O state (annealing state), and the connector billet 310 (that is the TA4-M (annealing state) titanium alloy) TA4 still remains in an M state.

T1012: Perform stamping and forging on the composite billet.

The composite billet 320 of a required specification is obtained by processing the composite billet through stamping and forging, computer digital control and double-sided grinding. In a process of stamping and forging, stamping and forging are performed from an internal region of the connector billet 310. After the stamping and forging are performed, a portion of the connector billet 310 is still retained on a top surface of the middle frame billet 23, and the punched portion of the connector billet 310 is embedded into the middle frame billet 23.

T1013: Machine the composite billet.

The stamped and forged composite billet 320 is machined (an unnecessary portion of the billet is removed). Steps of machining including computer digital control, combination of metal and plastic by nanotechnology, computer digital control, mechanical grinding and polishing of an appearance surface, and the like, are performed to obtain the middle frame 2 with a connector in a required shape and appearance. Some of the connectors 3 are exposed on a surface of the middle frame. Anodic oxidization treatment is performed on a machined material. The connector 3 made of a titanium alloy material has excellent corrosion resistance, and corrosion does not occur when anodic oxidation is performed on the middle frame 2 made of an aluminum alloy material.

T1014: Perform heat treatment on the middle frame.

Solution and aging treatment is performed, so that the 6013 (natural aging state) aluminum alloy (that is, the middle frame billet 23) changes to the T6 state (peak aging state), and the TA4-M (annealing state) titanium alloy (that is, the connector billet 310) still remains in the M state.

Optionally, heat treatment in step T1014 may be performed on the composite billet first, and then machining in step T1013 is performed.

T102: Provide a vapor chamber 4.

For a specific manufacturing method of the provided vapor chamber 4, refer to the manufacturing method of the vapor chamber 4 in the second aspect. Details are not described herein again.

T103: Mount the vapor chamber 4 on the middle frame 2.

For mounting of the vapor chamber 4, refer to Embodiment 1, and details are not described herein again.

Embodiment 4

This embodiment provides a middle frame assembly 1. A difference between this embodiment and Embodiment 3 lies in that a large piece of raw material may be first compounded. Specifically, in this embodiment, at least two connector billets may be combined with a large-sized middle frame billet in a hot-stack rolling manner to obtain a composite billet, and the composite billet is cut to form a plurality of small-sized middle frame composite billets.

In this embodiment, in a case in which a requirement on an appearance of an anode is not high, the large piece of raw material is compounded, and is prepared by using a cutting process, so that processing efficiency is high and costs are low.

Embodiment 5

This embodiment provides a middle frame assembly 1. A difference between a structure of the middle frame assembly in Embodiment 5 and a structure of the middle frame assembly in Embodiment 3 lies in that a structure of a middle frame 2 is different from that of a connector 3. Specifically, the middle frame in Embodiment 3 is in an integrated structure, and the connector in also in an integrated structure, and the middle frame in this embodiment is in a split structure and the connector in this embodiment is also in a split structure. A specific structure of the middle frame assembly 1 in this embodiment is as follows (for a structure of a vapor chamber 4, refer to the specific structure of the vapor chamber 4 provided in the first aspect. Details are not described herein again. For materials of the middle frame, the connector, and the vapor chamber in Embodiment 5, refer to Embodiment 1).

Figure 35:
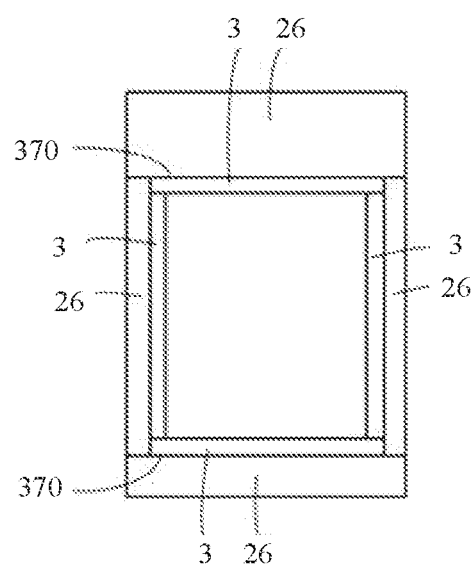
FIG. 35 is a schematic diagram of a structure of a middle frame and a connector according to Embodiment 5 of this application.

As shown in FIG. 35, the middle frame 2 includes four sub-frame parts 26, and there are four connectors 3 that are in a strip-like layout. The four connectors 3 are respectively correspondingly combined on the four sub-frame parts 26, and the four sub-frame parts 26 combined with the connectors 3 are spliced into the middle frame 2, The connectors 3 and the middle frame 2 may be combined by thermal diffusion or hot stack rolling.

In a possible implementation, there are at least two sub-frame parts 26. For example, there may be two, three, or five sub-frame parts 26. A split sub-frame part can improve material utilization and reduce material costs.

In a possible implementation, an antenna gap 370 is disposed on the middle frame with the connectors, and is configured to mount an antenna.

An overall structure of the middle frame assembly 1 in Embodiment 5 is the same as that in Embodiment 3, but manners of forming the middle frame and the connector are different. Details are not described herein again.

Figure 36:
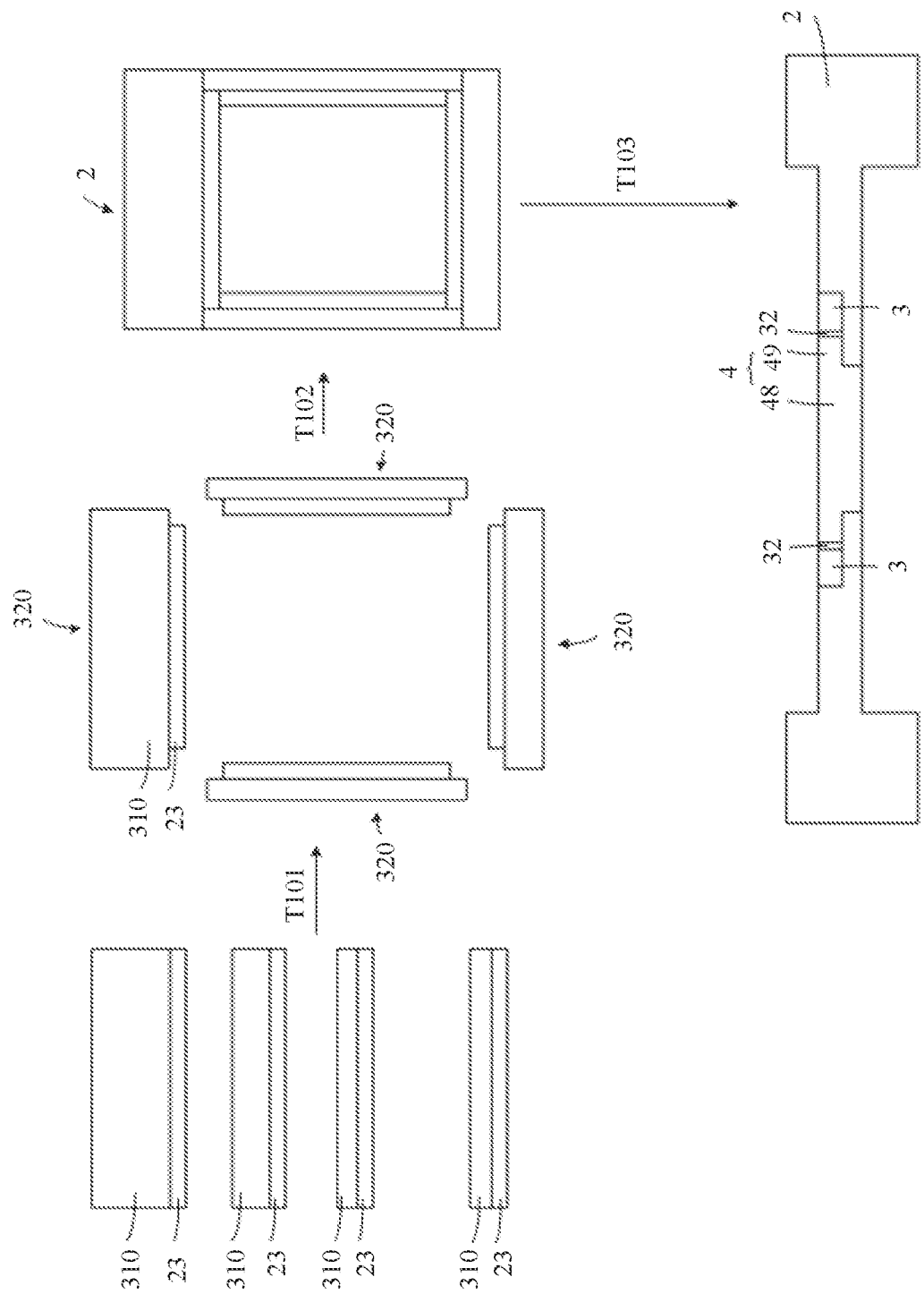
FIG. 36 is a flowchart of manufacturing a middle frame assembly according to Embodiment 5 of this application.

This embodiment provides a manufacturing method of the middle frame assembly 1. As shown in FIG. 36, a specific manufacturing method of the middle frame assembly 1 is as follows.

T101: Manufacture a composite billet.

A 6013-T4 (natural aging state) aluminum alloy billet of a required size specification is obtained by using an aluminum alloy extrusion process, and double-sided grinding and surface finishing are performed on the 6013-T4 (natural aging state) aluminum alloy billet to obtain a spare middle frame billet 23. Surface finishing is performed on a TA4-M (annealing state) titanium alloy of a specific size specification to obtain a spare connector billet 310. The middle frame billet 23 and the connector billet 310 are compounded through thermal diffusion or hot stack rolling to obtain a composite billet. In this case, the middle frame billet 23 (that is, the 6013-T4 (natural aging state) aluminum alloy) changes from a T4 state to an O state (annealing state), and the connector billet 310 (that is, the TA4-M (annealing state) titanium alloy) TA4 still remains in an M state. Solution and aging treatment is performed on the composite billet, so that the 6013 (natural aging state) aluminum alloy (that is, the middle frame billet 23) changes to the T6 state (peak aging state), and the TA4-M (annealing state) titanium alloy (that is, the connector billet 310) still remains in the M state. A large-sized composite billet is cut to form four small-sized composite billets 320.

The cut composite billet 320 is machined. Steps of machining including computer digital control, combination of metal and plastic by nanotechnology, computer digital control, mechanical grinding and polishing of an appearance surface, and the like, are performed to obtain four composite billets 320 of required dimensions and specifications.

T102: Splice the four composite billets 320 by plastic injection molding or welding to form a frame body of a middle frame 2, and perform machining processing such as computer digital control, combination of metal and plastic by using nanotechnology, computer digital control, mechanical grinding and polishing of an appearance surface on a spliced frame body to accurately adjust a size of the middle frame 2, and perform anodic treatment. A connector 3 made of a titanium alloy material has excellent corrosion resistance, so that corrosion does not occur when anodic oxidation is performed on the middle frame 2 made of the aluminum alloy material.

T103: Provide a vapor chamber 4, and mount the vapor chamber 4 on the middle frame 2.

In FIG. 36, a schematic diagram of the middle frame 2 after step T102 is a top view of the middle frame 2, and a schematic diagram of the middle frame 2 on which the vapor chamber 4 is mounted after step T103 is a sectional vie.

For mounting of the vapor chamber 4, refer to Embodiment 1, and details are not described herein again.

Compared with Embodiment 3 and Embodiment 4, in Embodiment 5, a middle frame is formed by splicing split composite billets. This can improve material utilization and reduce material costs.

Embodiment 6

Figure 37:
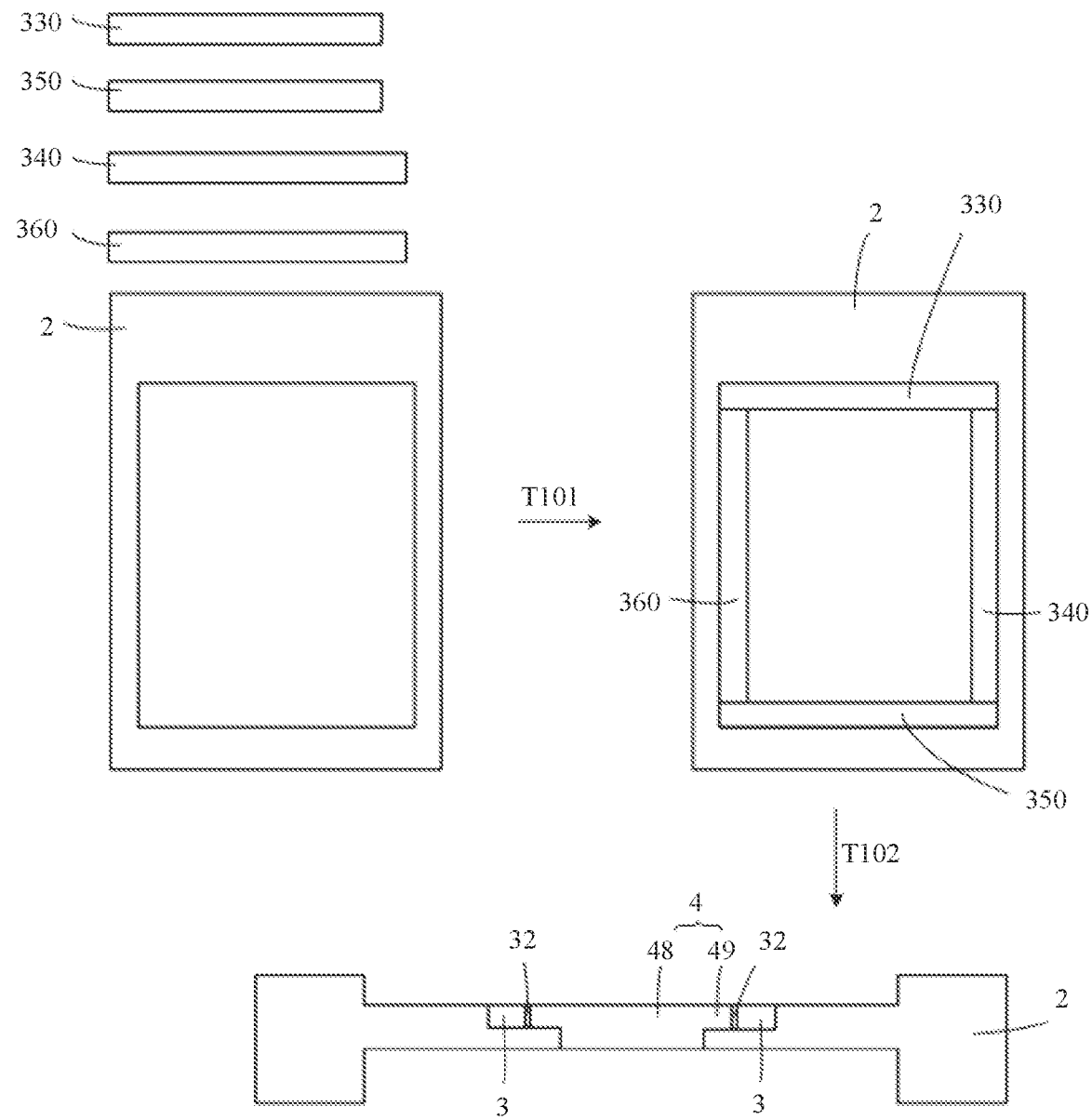
FIG. 37 is a flowchart of manufacturing a middle frame assembly according to Embodiment 6 of this application.
Figure 38:
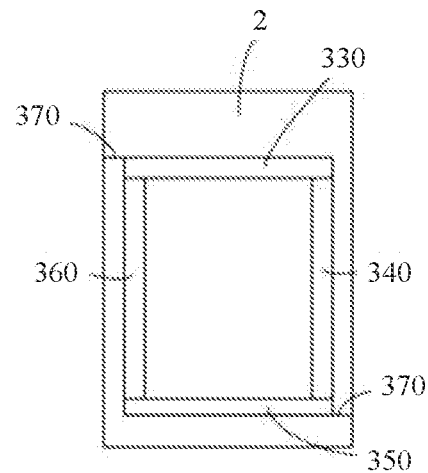
FIG. 38 is a schematic diagram of a structure showing a combination of a middle frame and a connector according to Embodiment 6 of this application.

This embodiment provides a middle frame assembly 1. A structure of the middle frame assembly 1 in Embodiment 6 is the same as that of the middle frame assembly in Embodiment 5, and details are not described herein again (for materials of the middle frame, the connector, and the vapor chamber in this embodiment, refer to Embodiment 1). A difference between Embodiment 6 and Embodiment 5 lies in that, in Embodiment 5, a composite billet is first formed by thermal diffusion or hot stack rolling, then a plurality of small-sized composite billets are formed by cutting, and the plurality of composite billets are spliced to form a middle frame. In Embodiment 6, split middle frame billets are first spliced to form a middle frame framework or an integrated middle frame is used, then, the at least two split connectors are combined to the spliced middle frame by thermal diffusion or hot stack rolling. Specifically, this embodiment provides a manufacturing method of a middle frame assembly 1. As shown in FIG. 37 and FIG. 38, a specific manufacturing method of the middle frame assembly 1 is as follows:

T101: Manufacture a composite billet.

A 6013-T4 (natural aging state) aluminum alloy billet of a required size specification is obtained by using an aluminum alloy extrusion process, and double-sided grinding and surface finishing are performed on the 6013-T4 (natural aging state) aluminum alloy billet to obtain a spare middle frame billet. The middle frame billet is machined to form a middle frame 2, and surface finishing is performed on a TA4-M (annealing state) titanium alloy of a specific size specification to obtain a spare connector billet. A large-sized connector billet is cut to form four small-sized connector billets (that is, a first connector billet 330, a second connector billet 340, a third connector billet 350, and a fourth connector billet 360). The middle frame 2 is spliced with the first connector billet 330, the second connector billet 340, the third connector billet 350, and the fourth connector billet 360 by thermal diffusion or hot stack rolling, and solution and aging treatment is performed on a spliced material. In this case, the 6013-T4 (natural aging state) aluminum alloy (that is, the middle frame billet 23) changes to a T6 state (peak aging state), and the TA4-M (annealed state) titanium alloy (that is, the connector billet 310) still remains in the M state.

The middle frame 2 on which the solution and ageing treatment is performed is machined. Steps of machining including computer digital control, combination of metal and plastic by nanotechnology, computer digital control, mechanical grinding and polishing of an appearance surface, and the like, are performed to form the middle frame 2 of a required size and appearance. Anodic oxidization treatment is performed on the machined middle frame. A connector made of a titanium alloy material has corrosion resistance, so that corrosion does not occur in a process of anodic oxidization.

T102: Provide a vapor chamber 4, and mount the vapor chamber 4 on the middle frame 2.

In FIG. 37, a schematic diagram of the middle frame 2 after step T101 is a top view of the middle frame 2, and a schematic diagram of the middle frame 2 on which the vapor chamber 4 is mounted after step T102 is a sectional vie.

For mounting of the vapor chamber 4, refer to Embodiment 1, and details are not described herein again.

Figure 39:
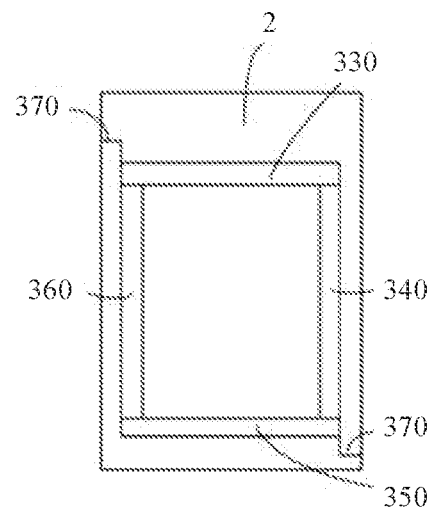
FIG. 39 is a schematic diagram of a structure showing a combination of another middle frame and a connector according to Embodiment 6 of this application.
Figure 40:
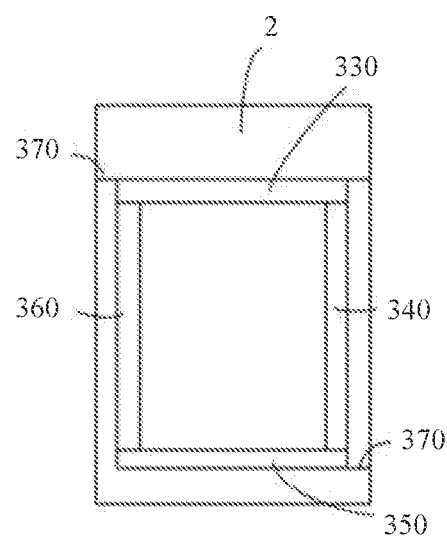
FIG. 40 is a schematic diagram of a structure showing a combination of another middle frame and a connector according to Embodiment 6 of this application.

In Embodiment 6, a frame body of the middle frame is formed, and then a strip-shaped connector is combined with the middle frame by thermal diffusion or hot stack rolling, Compared with Embodiment 5, a position and a quantity of antenna gaps 370 in Embodiment 6 may be set as required (refer to FIG. 38, FIG. 39, and FIG. 40), and the quantity of the antenna gaps 370 may be two, three, four, or the like, which are not limited by a position of a splicing gap.

Embodiment 7

This embodiment provides a middle frame assembly. The middle frame assembly in Embodiment 7 may be the middle frame assembly in any one of Embodiment 1 to Embodiment 6 (that is, a structure of the middle frame assembly in Embodiment 7 may be the same as the structure of the middle frame assembly in any one of Embodiment 1 to Embodiment 6).

A difference between Embodiment 7 and Embodiment 1 to Embodiment 6 lies in that Embodiment 7 provides a manufacturing method of a middle frame assembly. In a process of processing a middle frame, anodic oxidization treatment in Embodiment 1 to Embodiment 6 may be replaced by spraying, vacuum non-conductive coating, physical vapor deposition, or chemical vapor deposition, to form a protective film on a surface of the middle frame to protect the middle frame. Because anodic oxidization treatment does not need to be performed, a connector may be made of a plurality of materials such as stainless steel and copper alloy.

Example embodiments of this application are described above. It should be noted that a person of ordinary skill in the art may further make several improvements and modifications without departing from the principle of this application, and these improvements and modifications are also considered to be within the protection scope of this application.

What is claimed is:

1. A vapor chamber comprising:
   a first cover comprising:
      a first edge; and
      a first cover body comprising a first hole, wherein the first hole comprises a second edge; and
   a second cover comprising:
      a second cover body comprising a second hole, wherein the second hole comprises a third edge, and wherein the first cover body and the second cover body are oppositely disposed with a spacing between the first cover body and the second cover body;
   a first metal layer comprising:
      a main body region; and
      an edge region surrounding the main body region and configured to combine with the first edge as a closed cavity between the first cover and the second cover;
   a second metal layer overlapping the main body region and located in the closed cavity, wherein the second metal layer comprises a surface, and wherein a first material strength of the first metal layer is greater than a second material strength of the second metal layer; and
   a wick structure on the surface; and
   a sealing structure in a sealed connection to the first cover body and the second cover body at the first hole and the second hole, wherein the first hole and the second hole are connected to form a through hole of the vapor chamber, and wherein the sealing structure is independent of the first cover body and the second cover body and is configured to enclose a hollow channel, and wherein the sealing structure comprises:

a first connection end that is sealed and welded to the first cover body at the second edge; and a second connection end that is sealed and welded to the second cover body at the third edge, wherein the hollow channel of the sealing structure is connected between the first hole and the second hole, to form the through hole of the vapor chamber.

2. The vapor chamber of claim 1, wherein the first cover further comprises a third metal layer, and wherein a first material of the third metal layer and a second material of the first metal layer are of a same type or different types that have weldability.

3. The vapor chamber of claim 1, wherein the sealing structure comprises:

a first boss integrated with the first cover body and located at the second edge; and a second boss integrated with the second cover body, located at the third edge, and coupled to the first boss.

4. The vapor chamber of claim 1, wherein the first cover body is on a reference plane, and wherein either an extension direction of the through hole is perpendicular to the reference plane or an included angle between the extension direction and the reference plane is less than 90 degrees.

5. The vapor chamber of claim 1, further comprising a connection structure disposed in the closed cavity, wherein the connection structure comprises two ends that are fixedly coupled to the first cover and the second cover.

6. The vapor chamber of claim 5, wherein the connection structure is disposed in a middle region of the closed cavity.

7. A middle frame assembly comprising:

a middle frame comprising a through hole;

connectors fixedly coupled to the middle frame, wherein at least some of the connectors are exposed as a welding part;

a vapor chamber accommodated in the through hole and comprising:

a vapor chamber body; and a surrounding edge surrounding the vapor chamber body and welded to the welding part;

a joint between a first connector of the connectors and the middle frame;

a first limiting structure at the joint and configured for first position limiting in a first direction; and a second limiting structure comprising the first connector welded to the surrounding edge and configured for second position limiting in a second direction, wherein the first direction and the second direction are opposite directions, and wherein the first connector is configured to clamp between the middle frame and the surrounding edge to couple between the first limiting structure and the second limiting structure and provide third position limiting in the first direction and the second direction.

8. The middle frame assembly of claim 7, wherein the connectors and the surrounding edge are of a same type or different types of metal materials that have weldability.

9. The middle frame assembly of claim 8, wherein the middle frame further comprises a surface carrying a component in a terminal device, wherein the through hole comprises an inner wall, and wherein the welding part is located on the inner wall or the surface.

10. The middle frame assembly of claim 7, wherein the middle frame further comprises a surface, and wherein the first connector is embedded into the middle frame and comprises:

a first end surface;

a second end surface opposite to the first end surface and exposed on the surface to form the welding part; and a side surface coupled between the first end surface and the second end surface and located in the middle frame.

11. The middle frame assembly of claim 10, wherein the first limiting structure is located on the first end surface, wherein the second limiting structure is located on the second end surface, and wherein the first limiting structure comprises:

a position-limiting step on the middle frame; and a position-limiting pin that is on the first end surface, located on a side of the position-limiting step away from the second limiting structure, and fixedly lapped on the position-limiting step.

12. The middle frame assembly of claim 10, wherein the first limiting structure is located on the side surface, wherein the second limiting structure is located on the second end surface, and wherein the first limiting structure comprises:

a concave part on the side surface; and a protrusion part on the middle frame and configured to operate with the concave part.

13. The middle frame assembly of claim 10, further comprising a limiting surface that is an inclined surface extending obliquely relative to the second end surface, wherein the first limiting structure and the second limiting structure are located on the second end surface, wherein the side surface is coupled to the second end surface through the limiting surface, wherein the second end surface is welded to the surrounding edge.

14. The middle frame assembly of claim 13, wherein the first limiting structure comprises:

the limiting surface; and a limiting part of the middle frame that is configured to operate with the limiting surface and fixedly coupled between the surrounding edge and the limiting surface.

15. The middle frame assembly of claim 7, wherein the first connector is coupled to a surface based on hot stack rolling.

16. The middle frame assembly of claim 7, wherein the first connector is coupled to a surface based on thermal diffusion.

17. An electronic device comprising:

a middle frame comprising a first surface;

connectors fixedly coupled to the middle frame, wherein at least some of the connectors are exposed on the first surface as a welding part;

a vapor chamber comprising:

a vapor chamber body;

a surrounding edge surrounding the vapor chamber body and welded to the connectors, wherein the connectors and the surrounding edge are of a same type or different types of metal materials that have weldability;

a first cover comprising:

a first edge; and a first cover body comprising a first hole, wherein the first hole comprises a second edge; and a second cover comprising:

a second cover body comprising a second hole, wherein the second hole comprises a third edge, and wherein the first cover body and the second cover body are oppositely disposed with a spacing between the first cover body and the second cover body;

a first metal layer comprising:
  a main body region; and
  an edge region surrounding the main body region and configured to combine with the first edge as a closed cavity between the first cover and the second cover and the surrounding edge;
a second metal layer overlapping the main body region and located in the closed cavity, wherein the second metal layer comprises a surface; and
a wick structure formed on the surface; and
a sealing structure in a sealed connection to the first cover body and the second cover body at the first hole and the second hole, wherein the first hole and the second hole are connected to form a through hole of the vapor chamber, and wherein the sealing structure is independent of the first cover body and the second cover body and is configured to enclose a hollow channel, and wherein the sealing structure comprises:
  a first connection end that is sealed and welded to the first cover body at the second edge; and
  a second connection end that is sealed and welded to the second cover body at the third edge,
  wherein the hollow channel of the sealing structure is connected between the first hole and the second hole, to form the through hole of the vapor chamber; and
an electronic component disposed on the vapor chamber.

18. The electronic device of claim 17, further comprising a flexible circuit board, wherein the middle frame further comprises:
  a second surface configured to carry the electronic component; and
  a first through hole comprising an inner wall wherein the vapor chamber is located at the first through hole and comprises a second through hole,
  wherein the welding part is the inner wall or the second surface,
  wherein the vapor chamber, the middle frame, and the connectors jointly are a middle frame assembly,
  wherein the flexible circuit board is configured to pass through the second through hole and is distributed on two opposite sides of the middle frame assembly.

19. The electronic device of claim 17,
  wherein a first material strength of the first metal layer is greater than a second material strength of the second metal layer.

* * * * *